United States Patent
Adiga et al.

(10) Patent No.: US 10,916,690 B2
(45) Date of Patent: Feb. 9, 2021

(54) ELECTRICAL LEADS FOR TRENCHED QUBITS

(71) Applicant: International Business Machines Corporation, Armonk, NY (US)

(72) Inventors: Vivekananda P. Adiga, Ossining, NY (US); Martin O. Sandberg, Ossining, NY (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/202,828

(22) Filed: Nov. 28, 2018

(65) Prior Publication Data

US 2020/0168782 A1    May 28, 2020

(51) Int. Cl.
*G06N 10/00* (2019.01)
*B82Y 10/00* (2011.01)
(Continued)

(52) U.S. Cl.
CPC .......... *H01L 39/2467* (2013.01); *B82Y 10/00* (2013.01); *G06N 10/00* (2019.01); *H01L 39/223* (2013.01); *H01L 39/2493* (2013.01)

(58) Field of Classification Search
None
See application file for complete search history.

(56) References Cited

U.S. PATENT DOCUMENTS 4,370,359 A    1/1983 Fetter et al.
4,430,662 A * 2/1984 Jillie, Jr. ............. H01L 39/2493
                                                        257/36
(Continued)

FOREIGN PATENT DOCUMENTS

JP    H0437074 A  *  2/1992  ............. H01L 39/22
JP    3084045 B2     9/2000

OTHER PUBLICATIONS

Lecocq et al., "Junction fabrication by shadow evaporation without a suspended bridge," Nanotechnology 22, 2011, 6 pages.
(Continued)

*Primary Examiner* — Julio J Maldonado
*Assistant Examiner* — Lawrence C Tynes, Jr.
(74) *Attorney, Agent, or Firm* — Amin, Turocy & Watson, LLP

(57) ABSTRACT

Techniques for forming quantum circuits, including connections between components of quantum circuits, are presented. A trench can be formed in a dielectric material, by removing a portion of the dielectric material and a portion of conductive material layered on top of the dielectric material, to enable creation of circuit components of a circuit. The trench can define a regular nub or compensated nub to facilitate creating electrical leads connected to the circuit components on a nub. The compensated nub can comprise recessed regions to facilitate depositing material during evaporation to form the leads. For compensated nub implementation, material can be evaporated in two directions, with oxidation performed in between such evaporations, to contact leads and form a Josephson junction. For regular nub implementation, material can be evaporated in four directions, with oxidation performed in between the third and fourth evaporations, to contact leads and form a Josephson junction.

8 Claims, 18 Drawing Sheets

(51) Int. Cl.
*H01L 39/24* (2006.01)
*H01L 39/22* (2006.01)

(56) References Cited

U.S. PATENT DOCUMENTS

| | | | |
|---|---|---|---|
| 4,491,795 A * | 1/1985 | Gelinas | G01R 33/0354 257/34 |
| 4,526,858 A | 7/1985 | Lukens et al. | |
| 5,196,395 A * | 3/1993 | James | H01L 39/225 216/101 |
| 6,160,266 A * | 12/2000 | Odagawa | H01L 39/225 257/36 |
| 7,176,066 B2 | 2/2007 | Brenner et al. | |
| 7,253,654 B2 | 8/2007 | Amin | |
| 8,476,662 B2 * | 7/2013 | Park | H01L 24/48 257/98 |
| 8,918,152 B2 | 12/2014 | Strachan et al. | |
| 9,564,573 B1 | 2/2017 | Chang et al. | |
| 2003/0107041 A1 * | 6/2003 | Tanimoto | H01L 29/94 257/77 |
| 2006/0289968 A1 * | 12/2006 | Sulfridge | H01L 27/14601 257/621 |
| 2007/0194225 A1 * | 8/2007 | Zorn | G01Q 60/12 250/306 |
| 2010/0171139 A1 * | 7/2010 | Muranaka | H01L 33/60 257/98 |
| 2011/0233639 A1 * | 9/2011 | Yamakoshi | G11C 5/06 257/316 |
| 2014/0124801 A1 * | 5/2014 | Lee | H01L 33/62 257/88 |
| 2015/0021782 A1 * | 1/2015 | Kodama | H01L 21/31144 257/773 |
| 2016/0093790 A1 | 3/2016 | Rigetti et al. | |
| 2016/0104073 A1 * | 4/2016 | Sandberg | H01L 39/223 257/32 |
| 2016/0293719 A1 * | 10/2016 | Mihara | H01L 29/42344 |

OTHER PUBLICATIONS

Dunsworth et al., "Characterization and Reduction of Capacitive Loss Induced by Sub-Micron Josephson Junction Fabrication in Superconducting Qubits," arXiv:1706.00879v1 [quant-ph], Jun. 3, 2017, 9 pages.
Dolan, "Offset masks for lift-off photoprocessing," Applied Physics Letters, vol. 31, No. 5, Sep. 1, 1977, pp. 337-339, 4 pages.
Dolan et al., "Very small (> 20 nm) lithographic wires, dots, rings, and tunnel junctions," Physics B 152, 1988, pp. 7-13, 7 pages.
"Shadow Mask Area Correction for Tunnel Junctions," U.S. Appl. No. 15/805,306, filed Nov. 7, 2017, 87 pages.
International Search Report and Written Opinion for International Application Serial No. PCT/EP19/82186 dated Apr. 29, 2020, 15 pages.

* cited by examiner

ELECTRICAL LEADS FOR TRENCHED QUBITS

BACKGROUND

The subject disclosure relates to quantum circuits, e.g., quantum circuit design. Quantum computing employs quantum physics to encode and process information rather than binary digital techniques based on transistors. A quantum computing device employs quantum bits (also referred to as qubits) that operate according to the laws of quantum physics and can exhibit phenomena such as superposition and entanglement. The superposition principle of quantum physics allows qubits to be in a state that partially represent both a value of "1" and a value of "0" at the same time. The entanglement principle of quantum physics allows qubits to be correlated with each other such that the combined states of the qubits cannot be factored into individual qubit states. For instance, a state of a first qubit can depend on a state of a second qubit. As such, a quantum circuit can employ qubits to encode and process information in a manner that can be significantly different from binary digital techniques based on transistors.

A qubit, such as, for example, a transmon qubit, traditionally can comprise two capacitor pads interconnected by a Josephson junction. With regard to formation of qubits (e.g., transmon qubits) and quantum circuits (e.g., using microfabrication techniques for superconducting circuits), a significant aspect of quantum circuits can be high coherence or high quality factor qubits. Processes that can be utilized to achieve high coherence and high quality factor qubits for quantum circuits can involve creating deep trenches (e.g., through the etching and/or removal of dielectric substrate material). If a very isotropic etch or certain anisotropic create trenches that follow crystallographic planes of the underlying substrate, overhang of the superconducting material can result. The overhang of superconducting material can pose a problem for qubits (e.g., transmon qubits) when trying to form electrical connection between the capacitor pads and the Josephson junction that can be formed in the trenched region. A reason why the connection can be prevented is self-shadowing by the overhang that can prevent the evaporated metal of the Josephson junction to climb all the way up the trench side wall to connect to the capacitor pad.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, computer-implemented methods, apparatuses, and/or computer program products that can facilitate efficient formation of circuit components associated with poles of a qubit, formation of a junction component, and formation and connection of leads (e.g., electrical leads) between the circuit components and junction component.

According to an embodiment, a system comprising a memory that stores computer-executable components; and a processor, operatively coupled to the memory, that executes computer-executable components. The computer-executable components can comprise an etcher component that forms a trench in a dielectric material to enable creation of circuit components of a circuit. The computer-executable components also can include an evaporator component that forms a junction component of the circuit, and conductive leads that connect the circuit components to the junction component, based on a first evaporation of a first portion of a material along a first direction and a second evaporation of a second portion of the material along a second direction, wherein an oxidation is performed between the first evaporation and the second evaporation, and wherein the first direction is distinct from the second direction. The system can have a number of advantages, including that the system can more efficiently form circuit components, junction components, and conductive leads, and connect the conductive leads from circuit components to the junction component of the circuit.

In some embodiments, a first nub component can be a compensated nub component that comprises extended portions that extend away from a nub base portion of the first nub component, wherein the extended portions can be arranged in relation to each other or in relation to a bridge portion of the first pole to form one or more recessed regions to facilitate forming the conductive lead, and connecting the conductive lead between the circuit component and the junction component, based on the first evaporation of the first material or the second evaporation of the second material on or in proximity to the first nub component. In certain embodiments, the evaporator component can form the junction component, and the conductive leads that connect the circuit components to the junction component, by evaporation of the material along four directions, wherein a third evaporation of a third portion of the material is performed along a third direction of the four directions, wherein a fourth evaporation of a fourth portion of the material is performed along a fourth direction of the four directions, and wherein the third evaporation and the fourth evaporation are shallow angle evaporations performed at defined angles with respect to the first pole and the second pole. These embodiments of the system can provide a number of advantages, including that the system can reduce ion beam damage at the aluminum/dielectric material interface and/or can allow for deeper trenching of the dielectric material, while maintaining desirable (e.g., suitable) connectivity to the junction component, and/or can reduce the amount of undercutting of underlying dielectric material with respect to the conductive material in proximity to a circuit component formed on the nub component of a pole to enable desirable connectivity of a conductive lead from the circuit component to the junction component.

Another embodiment relates to a computer-implemented method that comprises forming, by a system operatively coupled to a processor, a trench in a dielectric material to enable creating circuit components of a circuit. The computer-implemented method also comprises forming, by the system, a junction component of the circuit, and electrical leads that connect the circuit components to the junction component, by evaporating a first portion of a material along a first direction and evaporating a second portion of the material along a second direction, wherein an oxidation is performed in between the evaporating of the first portion and the evaporating of the second portion, and wherein the first direction is different from the second direction. The computer-implemented method can have a number of advantages, including that the method can more efficiently form circuit components, junction components, and electrical leads, and connect the electrical leads from circuit components to the junction component of the circuit.

In certain embodiments, the computer-implemented method also can comprise forming, by the system, the first nub component comprising extended portions that can extend away from a nub base portion of the first nub component, wherein the extended portions can be arranged in relation to each other or in relation to a bridge portion of the first pole to form one or more recessed regions to facilitate the first evaporation of the first material or the second evaporation of the second material on or in proximity to a circuit component of the circuit components. In other embodiments, the computer-implemented method can comprise evaporating, by the system, a third portion of the material along a third direction via a first shallow angle evaporation at a defined first angle with respect to the first pole; and evaporating, by the system, a fourth portion of the material along a fourth direction via a second shallow angle evaporation at a defined second angle with respect to the second pole. Such embodiments of the method can provide a number of advantages, including that the method can reduce ion beam damage at the aluminum/dielectric material interface and/or can allow for deeper trenching of the dielectric material, while maintaining desirable (e.g., suitable) connectivity to the junction component, and/or can reduce the amount of undercutting of underlying dielectric material with respect to the conductive material in proximity to a circuit component formed on the nub component of a pole to enable desirable connectivity of an electrical lead from the circuit component to the junction component.

A further embodiment relates to a computer program product that facilitates forming a quantum computing circuit, the computer program product comprising a computer readable storage medium having program instructions embodied therewith. The program instructions are executable by a processor to cause the processor to form a trench in a dielectric material to enable creation of circuit components of the quantum computing circuit. The program instructions also are executable by the processor to create a junction component of the circuit, and conductive leads that connect the circuit components to the junction component, by evaporation of a first portion of a material along a first direction and evaporation of a second portion of the material along a second direction, wherein an oxidation is performed in between the evaporation of the first portion and the evaporation of the second portion, and wherein the first direction is distinct from the second direction. The computer program product can have a number of advantages, including that the computer program product can more efficiently form circuit components, junction components, and conductive leads, and connect the conductive leads from circuit components to the junction component of the circuit.

In some embodiments, the program instructions can be executable by the processor to cause the processor to: evaporate a third portion of the material along a third direction; evaporate a fourth portion of the material along a fourth direction; in response to the evaporation of the first portion of the material along the first direction, perform the oxidation; and evaporate the second portion of the material along the second direction. These embodiments of the computer program product can provide a number of advantages, including that the computer program product can reduce ion beam damage at the aluminum/dielectric material interface and/or can allow for deeper trenching of the dielectric material, while maintaining desirable (e.g., suitable) connectivity to the junction component.

According to still another embodiment, a device comprises a trench formed in a dielectric material, wherein the trench defines and separates poles of an electric dipole, comprising a first pole and a second pole, wherein the first pole comprises a first capacitor pad associated with a first nub component, wherein the second pole comprises a second capacitor pad associated with a second nub component. The device also can include a junction component and electrical leads formed based on a first evaporation of a first portion of a material along a first direction and a second evaporation of a second portion of the material along a second direction, wherein an oxidation is performed between the first evaporation and the second evaporation, wherein the first direction is distinct from the second direction, and wherein the electrical leads connect the junction component to the first capacitor pad and the second capacitor pad. The device can have a number of advantages, including that the system can more efficiently form circuit components, junction components, and electrical leads, and connect the electrical leads from circuit components to the junction component of the circuit.

In certain embodiments, the first nub component can comprise extended portions that extend away from a nub base portion of the first nub component, wherein the extended portions can be arranged in relation to each other or in relation to a bridge portion of the first pole to form one or more recessed regions to facilitate to facilitate the formation of an electrical lead of the electrical leads, and the connection of the electrical lead between the junction component and the first capacitor pad, based on the first evaporation of the first material or the second evaporation of the second material on or in proximity to the first nub component. Such embodiments of the device can provide a number of advantages, including that the device can reduce ion beam damage at the aluminum/dielectric material interface and/or can allow for deeper trenching of the dielectric material, while maintaining desirable (e.g., suitable) connectivity to the junction component, and/or can reduce the amount of undercutting of underlying dielectric material with respect to the conductive material in proximity to a circuit component formed on the nub component of a pole to enable desirable connectivity of an electrical lead from the circuit component to the junction component.

Yet another embodiment relates to a computer program product that facilitates creating a quantum computing circuit, the computer program product comprising a computer readable storage medium having program instructions embodied therewith. The program instructions are executable by a processor to cause the processor to etch a superconducting material and a dielectric material associated with the superconducting material to form a channel in the dielectric material and to create circuit components of the quantum computing circuit on the superconducting material. The program instructions also are executable by the processor to form a junction component of the circuit, and electrical leads that connect the circuit components to the junction component, by evaporation of a first portion of a material along a first direction and evaporation of a second portion of the material along a second direction, wherein an oxidation is performed in between the evaporation of the first portion of the material and the evaporation of the second portion of the material, and wherein the first direction is distinct from the second direction. The computer program product can have a number of advantages, including that the computer program product can more efficiently form circuit components, junction components, and electrical leads, and connect the electrical leads from circuit components to the junction component of the circuit.

In some example embodiments, the program instructions can be executable by the processor to cause the processor to evaporate a third portion of the material along a third direction; evaporate a fourth portion of the material along a fourth direction; in response to evaporation of the first portion of the material along the first direction, perform the oxidation; and evaporate the second portion of the material along the second direction. These embodiments of the computer program product can provide a number of advantages, including that the computer program product can reduce ion beam damage at the aluminum/dielectric material interface and/or can allow for deeper trenching of the dielectric material, while maintaining desirable (e.g., suitable) connectivity to the junction component.

These and other features will become apparent from the following detailed description of illustrative embodiments thereof, which is to be read in connection with the accompanying drawings.

DETAILED DESCRIPTION

Figure 1:
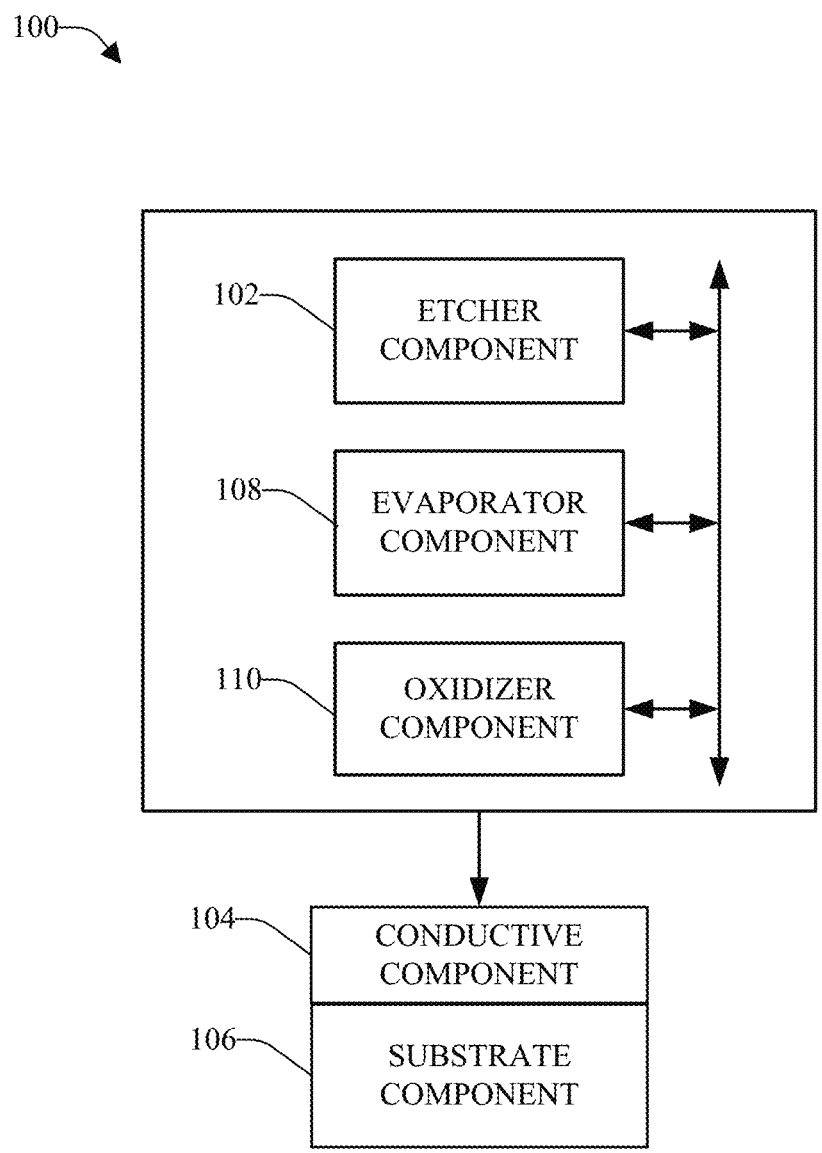
FIG. 1 illustrates a block diagram of an example, non-limiting system that can be utilized to efficiently form electrical leads and a junction component for a qubit of a quantum circuit, in accordance with various aspects and embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode and process information rather than binary digital techniques based on transistors. A quantum computing device employs quantum bits (also referred to as qubits) that operate according to the laws of quantum physics and can exhibit phenomena such as superposition and entanglement, as described herein. Quantum computing circuits can utilize superconducting materials in creating qubits. Superconducting quantum computing circuit operations can utilize resonant coupler (e.g., "bus") connectivity or capacitive coupler connectivity to directly couple quantum bits, which can be fixed in a quantum circuit design.

Quantum processors can be implemented using a number of different physical systems ranging from traveling photons to trapped ions to microfabricated superconducting circuits. The formation of quantum circuits using microfabrication techniques for superconducting circuits can be of significant consideration with regard to the disclosed subject matter.

Using superconducting circuits, a number of varieties of superconducting quantum bits (e.g., charge qubits, flux qubits, phase qubits, and so on) can be fabricated. The disclosed subject matter will primarily discuss the transmon qubit. However, it is to be appreciated and understood that the disclosed subject matter can be applicable to any type of superconducting qubit architecture. The transmon qubit traditionally comprises two capacitor pads that can be interconnected by a Josephson junction, although the transmon qubit can be extended to have multiple pads (e.g., more than two pads) in a multipole geometry, as more fully described herein.

With regard to formation of qubits and quantum circuits, a significant aspect of quantum circuits can be high coherence or high quality factor qubits. The coherence time can characterize the amount of time that a qubit can remain in its quantum state, including an entangled state, before being influenced by its external environment. Certain processes that can be utilized to attempt to achieve high coherence or high quality factor qubits for quantum circuits can involve creating deep trenches (e.g., through etching or removal of dielectric substrate material). Some of these etches to create trenches can follow crystallographic planes of the underlying substrate. For instance, if a very isotropic etch or certain anisotropic create trenches that follow crystallographic planes of the underlying substrate, overhang of the superconducting material can result.

Figure 18:
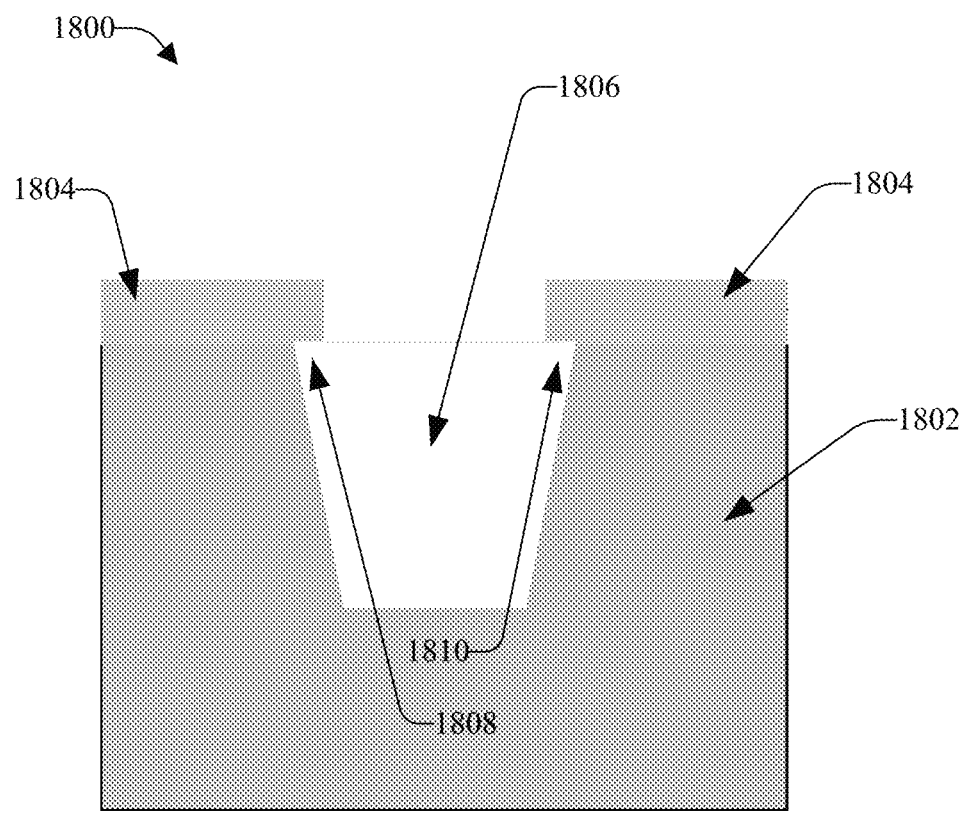
FIG. 18 depicts a diagram of an example trenching of a substrate that has a conductive material applied thereon.

Referring briefly to FIG. 18, FIG. 18 depicts a diagram of an example trenching 1800 of a substrate that has a conductive material (e.g., superconducting material) applied thereon. This can illustrate the overhang issue that can result from etching or otherwise removing dielectric material to create a trench. In the example trenching 1800, an etching of the dielectric substrate 1802 and the conductive material 1804 applied (e.g., deposited) thereon can be performed to remove a portion of the conductive material 1804 and a portion of the dielectric substrate 1802 to form a trench 1806 in the dielectric substrate 1802. As referenced at 1808 and 1810, when forming the trench 1806, the etch can undercut the exposed corners of the conductive material 1804 in relation to the dielectric material 1802, which can result in part of the conductive material 1804 forming an overhang that can extend beyond the remaining dielectric material 1802 and over the trench 1806 after the trenching process is performed. Part of the undercut of the conductive material 1804 can be due in part to exposed unwanted vertical surfaces that can be etched at a relatively faster rate than other surfaces. Also, exposed corners typically can be undercut relative faster than other regions due in part to exposed faster etching planes. Such undercutting of and/or overhanging of the exposed corners of the conductive material 1804 can make it undesirably difficult to contact the conductive material 1804 (e.g., to form electrical leads that can form a connection between circuit components and a Josephson junction). It is noted that, while etching, during forming of the trench 1806, can undercut the exposed corners of the conductive material 1804, it typically does not undercut, or at least does not significantly undercut, confined corners of the conductive material 1804.

The overhang of the superconducting material can pose a problem for transmon qubits when trying to form electrical connection between the capacitor pads and the Josephson junction that can be formed in the trenched region. The reason why the connection between the capacitor pads and the Josephson junction can be prevented, or at least otherwise negatively impacted, can be self-shadowing by the overhang of the superconducting material that can prevent the evaporated metal of the Josephson junction from climbing all the way up the trench side wall to connect to the capacitor pad. In the traditional transmon geometry, a small contact area protruding out from the capacitor pad, which can be referred to as a nub or contact nub, can be used to facilitate connecting the Josephson junction to the capacitor pad. The purpose of the nub can be to allow for step coverage from two directions, since two-angle evaporation typically can be used to form the Josephson junction. However, creating a qubit using traditional techniques for forming a trench, forming circuit components on poles, forming a Josephson junction, and/or forming connections between circuit components (e.g., capacitor pads) and the Josephson junction can be deficient.

One traditional technique for fabricating a Josephson junction can be a Dolan technique that can involve evaporating a material on poles of a qubit in two different directions that can be opposite to each other. An oxidation can be performed in between the evaporation of the material in the first direction and the evaporation of the material in the second direction, wherein the oxidation can facilitate forming the Josephson junction.

Another traditional technique for fabricating a Josephson junction can be a Manhattan technique that can involve evaporating a material on poles of a qubit in two different directions that can be perpendicular to each other. An oxidation can be performed in between the evaporation of the material in the first direction and the evaporation of the material in the second direction to facilitate forming the Josephson junction.

However, when deep trenches are created in order to try to achieve high coherence or high quality factor qubits for quantum circuits, the Dolan and Manhattan techniques each can be deficient as, for example, the connection to parts (e.g., capacitor pads) of the quantum circuit involving, for example, Josephson junctions, can be prevented, or at least can be undesirably and negatively impacted. These and other deficiencies of conventional techniques for formation of qubits and quantum circuits (e.g., connections to parts of the quantum circuit) can result in inefficient and/or ineffective qubits and quantum circuits, and/or inefficient performance of qubits and quantum circuits.

Thus, traditional techniques for forming trenches, electrical leads, qubits, and quantum circuits (e.g., quantum computing circuits), and connecting electrical leads to Josephson junctions, can be deficient and can be subject to a number of problems, such as described above, including an undesirable difficulty in efficiently or effectively forming sufficiently deep trenches in a substrate of a qubit to achieve a suitably high coherence or high quality factor qubit, while also being able to create electrical leads and suitable connectivity of the leads with a Josephson junction of the qubit, and an undesirable amount of undercutting of the substrate, with respect to the overlying conductive material, after forming a trench in the substrate.

The disclosed subject matter can have a number of advantages over these and other traditional techniques, and can be implemented to produce a solution to all or at least some of these problems and/or other problems with these and other traditional techniques, with regard to forming trenches, electrical leads, qubits, and quantum circuits, and connecting electrical leads to Josephson junctions, in the form of forming a desirably deeper trench in a qubit, while maintaining desirable (e.g., suitable) connectivity to a junction component (e.g., Josephson junction), forming a compensated nub component on a pole of a qubit to reduce the amount of undercutting of a substrate (e.g., dielectric material) with respect to overlying conductive material to enable desirably forming such deeper trench, and/or performing evaporation in two or four directions (e.g., performing evaporation of a desired material, such as aluminum, in four directions, using shallow evaporation techniques in two of the directions and other evaporation techniques in the other two directions). Through these and other features of the disclosed subject matter, the disclosed subject matter, for example, can enhance (e.g., improve, increase) the coherence or quality factor of qubits to desirably higher levels; can more efficiently create qubits (e.g., trenches, circuit components, electrical leads, Josephson junctions, . . . ); can reduce ion beam damage at the aluminum/substrate (e.g., dielectric material) interface and/or allow for deeper trenching (e.g., ranging from 50 nanometers (nm) to 500 nm, or more than 500 nm) of the dielectric material, while maintaining desirable (e.g., suitable) connectivity to a junction component of a qubit; can reduce the amount of undercutting of underlying dielectric material with respect to the overlying conductive material in proximity to a circuit component formed on a nub component of a pole to enable desirable connectivity of an electrical lead from the circuit component to the junction component; and/or, with regard to multipole qubits, can desirably create low loss superconducting contacts between pads (e.g., circuit component pads) of the same polarity.

To that end, various embodiments herein relate to techniques for forming quantum circuits, including connections between components of quantum circuits. A conductive material (e.g., a superconducting material) can be applied or deposited on a dielectric substrate. A trench can be formed in the dielectric material, by removing a portion of the dielectric material and a portion of the conductive material layered on top of the dielectric material, to enable creation of circuit components (e.g., capacitors, Josephson junctions) of a quantum circuit. The trench can form or define regular nubs or compensated nubs that can be utilized to facilitate creating electrical leads (e.g., electrical leads between capacitor pads and a Josephson junction) with the conductive material on the nubs (e.g., regular nubs or compensated nubs). The nubs formed or defined by the trench can be, can comprise, can be associated with, or can form or define resonators (e.g., bus or readout), coupling pads, and/or capacitor pads. In some embodiments, a compensated nub can comprise one or more recessed regions that can facilitate depositing material during evaporation to form the electrical leads, as more fully described herein. In other embodiments, the nubs formed or defined by the trench can be regular nubs that do not include such recessed regions.

In certain embodiments, the trench can be formed, and the resonators, coupling pads, and/or capacitor pads can be formed or defined, in a single lithography operation. For instance, the lithographically defined features (e.g., trench, resonators, coupling pads, and/or capacitor pads) can be formed by etching or lifting off a portion of the conductive material from the dielectric substrate on which the conductive material is situated. The lithographically defined features can be etched or lifted off such that a desirably deep trench, having a depth ranging from, for example, 50 nm to 500 nm, or more, can be formed in the dielectric material.

A second lithography operation (e.g., e-beam or optical lithography operation) can be performed to define the leads that connect to a Josephson junction. In accordance with various embodiments, the material (e.g., aluminum) can be evaporated along two directions or four directions with an oxidation interruption being performed in between two of the two or four evaporation operations, which can form the junction. For a compensated nub implementation, with regard to a dipole qubit, the material can be evaporated in a first direction and a second direction, with an oxidation operation (e.g., oxidation interrupt) performed in between the first evaporation and the second evaporation, to contact electrical leads (e.g., capacitor leads) and form a Josephson junction. In other embodiments, for a compensated nub implementation, with regard to a higher order pole (e.g., quadrupole) qubit, the material can be evaporated in four directions, with an oxidation operation performed in between the second evaporation of the material in the second direction and the third evaporation of the material in the third direction, to facilitate contacting electrical leads to and forming a Josephson junction.

For a regular nub implementation, with regard to a dipole qubit, the material can be evaporated in four directions. The first evaporation of the material in the first direction and the second evaporation of the material in the second direction can be shallow angle evaporations that can facilitate contacting electrical leads (e.g., electrical leads of the capacitor). A third evaporation of the material can be performed in the third direction, and a fourth evaporation of the material can be performed in the fourth direction, with an oxidation operation performed in between the third evaporation and the fourth evaporation, to facilitate contacting the electrical leads and forming a Josephson junction. In some embodiments, for a regular nub implementation, with regard to a higher order pole (e.g., quadrupole) qubit with no trench formed, the material can be evaporated in four directions, with an oxidation operation performed in between the second and third evaporations, to facilitate contacting electrical leads and forming a Josephson junction.

FIG. 1 illustrates a block diagram of an example, non-limiting system 100 that can be utilized to efficiently form electrical leads and a junction component for a qubit of a quantum circuit, in accordance with various aspects and embodiments of the disclosed subject matter. The system 100 can be utilized to form electrical leads and junction components (e.g., Josephson junctions) for qubits, for example, by employing shadow or shallow angle evaporation, while improving performance of the qubits of the quantum circuit.

The system 100 can form components, including qubits, of a quantum circuit, wherein the qubits can have a desirable capacitor-junction connection design. The desirable capacitor-junction connection design can allow for reduced ion beam damage at the aluminum/silicon interface, and can allow for deeper trenching of the silicon, while maintaining desirable (e.g., sufficient, acceptable, or suitable) junction connectivity, as compared to traditional techniques for forming trenches, electrical leads, and junctions. In some embodiments, the system 100 can execute an efficient four-angle evaporation scheme to form a Josephson junction and contact (e.g., connect) electrical leads (e.g., electrical leads of pads of capacitors) to the Josephson junction in a single fabrication operation using various (e.g., multiple) evaporation schemes.

The system 100 can comprise an etcher component 102 that can process (e.g., etch) materials, such as a conductive material of a conductive component 104 and a dielectric material of a substrate component 106. The conductive material of the conductive component 104 can be applied or layered on top of the dielectric material of the substrate component 106. In some embodiments, the conductive material of the conductive component 104 can be a desired superconducting material. The dielectric material can comprise silicon (e.g., a silicon-based material). In some embodiments, the etcher component 102 can be employed to etch or otherwise remove desired portions of materials, such as portions of the conductive material of the conductive component 104 and portions of the dielectric material of the substrate component 106, to form a trench in the dielectric material that can define or form the poles of a qubit, the nub components of the poles, and/or associated capacitor pads, coupling pads, or resonators (e.g., bus or the readout) of the qubit.

The etcher component 102 can utilize one or more desired techniques or processes, such as, for example, a lithography technique or process, an etching technique or process, and/or another technique or process to remove the desired portions of the conductive material from the conductive layer of the conductive component 104 and the desired portions of the dielectric material from the substrate component 106. The etcher component 102 can form the trench in the dielectric material to have a desired depth, which can range, for example, from 50 nm to at least 500 nm, or more, while the system 100 can still provide desirable (e.g., sufficient, acceptable, suitable) formation of electric leads (e.g., electric leads connecting the capacitor pads to the junction component) and maintain desirable (e.g., sufficient, acceptable, suitable) connectivity of the junction component (e.g., Josephson junction) of the qubit.

The formation of the trench can define or form the poles of the qubit, the nub components of the poles, and/or circuit components (e.g., capacitor pads, coupling pads, and/or resonators) of the qubit, wherein the circuit components can be located on the nub components of the poles. In some embodiments, the number of poles formed for the qubit can be two to form a dipole qubit, as more fully described herein. In other embodiments, the number of poles formed for the qubit can be more than two (e.g., four) to form a higher order pole qubit (e.g., a quadrupole qubit), as more fully described herein.

Figure 2:
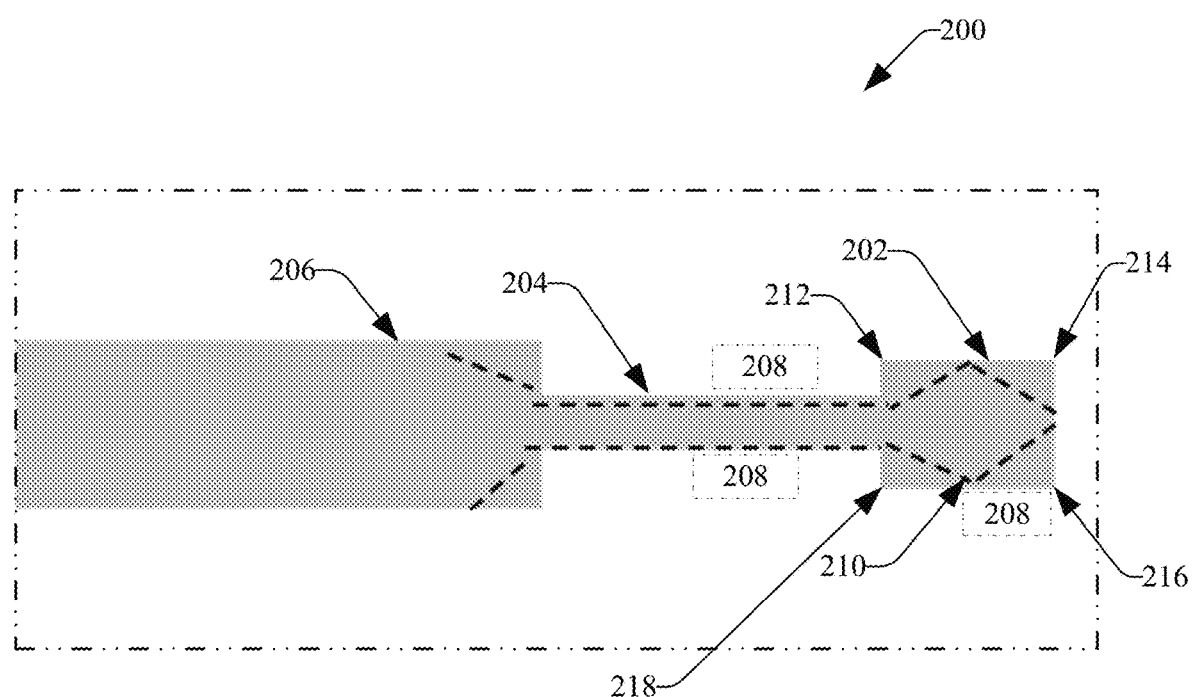
FIG. 2 depicts a diagram of an example pole comprising a regular nub component, in accordance with various aspects and embodiments of the disclosed subject matter.

With regard to the nub components of the poles, in accordance with various embodiments, the etcher component 102 can etch or remove portions of the conductive material and portions of the dielectric material to form the nub components that can be regular nub components or compensated nub components. Referring briefly to FIG. 2 (along with FIG. 1), FIG. 2 depicts a diagram of an example pole 200 comprising a regular nub component, in accordance with various aspects and embodiments of the disclosed subject matter. In some embodiments, the etcher component 102 can etch or remove portions of the conductive material of the conductive component 104 and portions of the dielectric material of the substrate component 106 to form nub components of the poles, such as example pole 200, that can be regular nub components. The pole 200 can comprise a regular nub component 202 that can have a desired size and shape (e.g., rectangular). The pole 200 can comprise a bridge portion 204 that can extend from a base portion 206 at one end of the bridge portion 204 to the regular nub component 202 at the other end of the bridge portion 204. The bridge portion 204 can have a desired size and shape (e.g., rectangular) and can, for example, be narrower in width than the width of the base portion 206 and regular nub component 202. In some embodiments, the length of the bridge portion 204 extending from the base portion 206 to the regular nub component 202 can be longer in size than the width across the bridge portion 204.

When the etcher component 102 forms the trench 208, which also can form and define the pole 200, the regular nub component 202, and various circuit components (e.g., capacitor pad, coupling pad, or resonator) on or associated with the regular nub component 202, for the qubit, the remaining dielectric material of the substrate component 106 can undercut the remaining conductive material of the conductive component 104, or correspondingly, the conductive material can overhang beyond the extent of the dielectric material (as depicted by the dotted line 210 indicating the example extent of the dielectric material after the trench is formed), particularly and significantly with regard to the exposed corners of the regular nub component, such as, for example, corners 212, 214, 216, and 218.

Figure 3:
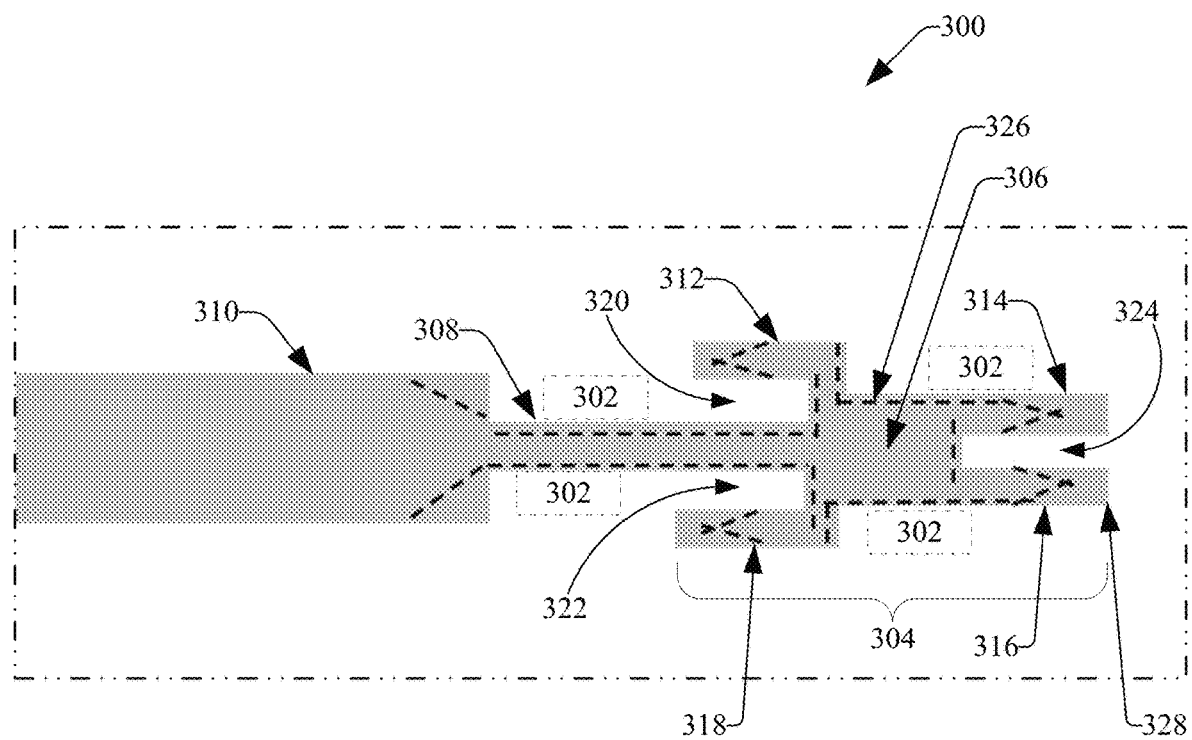
FIG. 3 illustrates a diagram of an example pole that can comprise a compensated nub component, in accordance with various aspects and embodiments of the disclosed subject matter.

Turning briefly to FIG. 3 (along with FIG. 1), FIG. 3 illustrates a diagram of an example pole 300 that can comprise a compensated nub component, in accordance with various aspects and embodiments of the disclosed subject matter. In certain embodiments, the etcher component 102 can etch or remove portions of the conductive material of the conductive component 104 and portions of the dielectric material of the substrate component 106 to form the trench 302 that can form or define nub components of the poles, such as example pole 300, wherein the nub components can be compensated nub components. For instance, the pole 300 can comprise a compensated nub component 304 that can include a nub base portion 306 that can have a desired size and shape (e.g., rectangular). The forming of the trench 302 also can form or define various circuit components (e.g., capacitor pad, coupling pad, or resonator) on the nub base portion 306.

The pole 300 also can comprise a bridge portion 308 that can extend from a base portion 310 at one end of the bridge portion 308 to the compensated nub component 304 at the other end of the bridge portion 308. The bridge portion 308 can have a desired size and shape (e.g., rectangular) and can, for example, be narrower in width than the width of the base portion 310 and the compensated nub component 304. In some embodiments, the length of the bridge portion 308 extending from the base portion 310 to the compensated nub component 304 can be longer in size than the width across the bridge portion 308.

The compensated nub component 304 can comprise a desired number of extended portions, including, for example, extended portions 312, 314, 316, and 318, that can extend from the nub base portion 306 by a desired length, and can be arranged in relation to each other, or in relation to the bridge portion 308 of the pole 300, to form one or more recessed (e.g., open) regions, such as, for example, recessed regions 320, 322, and 324, that can facilitate reducing the amount of overhang of the conductive material with respect to the dielectric material, or correspondingly, the amount of undercutting of the dielectric material with respect to the overlying conductive material, as more fully described herein. For instance, the compensated nub component 304, by having the extended portions (e.g., 312, 314, 316, and 318) extending from the nub base portion 306, can significantly reduce the amount of undercutting of the dielectric material with respect to the conductive material (as depicted by the dotted line 326 indicating the example extent of the dielectric material after the trench is formed), and correspondingly, the amount of overhang of the conductive material with respect to the extent of the underlying dielectric material, with regard to the nub base portion 306, as compared to, for example, the regular nub component of pole 200 of FIG. 2. For instance, it can be observed that the amount of undercutting of the dielectric material with respect to the conductive material (as depicted by the dotted line 326) in the recessed regions (e.g. 320, 322, and 324), where the recessed regions meet the nub base portion 306, as shown in FIG. 3, can be significantly less than the amount of undercutting of dielectric material with respect to conductive material (as depicted by the dotted line 210) for the exposed corners (e.g., 212, 214, 216, and 218) of the regular nub component 202, as shown in FIG. 2. Rather, with regard to the compensated nub component 304, the extended portions (e.g., 312, 314, 316, and 318) can have the exposed corners (e.g., corner 328) that can have the relatively higher amount of undercutting of dielectric material with respect to the conductive material of the exposed corners of the extended portions. An advantage of the compensated nub component 304 can be that, by reducing the amount of undercutting of the dielectric material with respect to the conductive material (as depicted by the dotted line 326), the disclosed subject matter (e.g., system 100) can more efficiently and more effectively evaporate or deposit material (e.g., aluminum or other desired material) on the nub base portion 306 to facilitate forming the junction component, and forming or connecting the electrical leads from the pads of the capacitors to the junction component. For example, with regard to compensated nub components (e.g., 304), due to the relatively smaller amount of overhang of the conductive material in relation to the underlying dielectric material, during the evaporation process, the evaporated material can extend or climb up the side walls of the trench and can overcome and form around the relatively smaller overhang of the conductive material to connect to the circuit components (e.g., capacitor pads, coupling pads, or resonators) of or associated with the compensated nub components (e.g., 304) to form electrical leads that connect the junction component (e.g., Josephson junction) formed at the bottom of the trench to the circuit components of or associated with the compensated nub components (e.g., 304), such as more fully described herein.

The system 100 also can include an evaporator component 108 that can employ one or more desired evaporation techniques or processes to evaporate or deposit a desired material (e.g., aluminum or other desired material) on the nub components (e.g., regular nub components or compensated nub components) from two or more (e.g., four) desired directions to facilitate forming the junction component and connecting electrical leads from the other circuit components (e.g., pad of a capacitor) to the junction component.

The system 100 further can comprise an oxidizer component 110 that can perform an oxidation operation or process, such as an oxidation interrupt, at a desired time during the evaporation operation on the nub components (e.g., perform the oxidation operation between two evaporations of material on the nub components in two different directions), as more fully described herein. The oxidation operation or process can facilitate forming the junction of the junction component. For example, the oxidizer component 110 can perform the oxidation operation or process to apply an oxygen-based or other chemical-based substance to a desired portion of the material deposited in the trench to facilitate oxidizing the portion of the material and forming the junction of the junction component.

It is to be appreciated and understood that, in accordance with various embodiments, respective operations performed by the etcher component 102, evaporator component 108, and/or oxidizer component 110 can be semi-automated or automated, and/or, as desired, some operations (e.g., certain etching operations, evaporation operations, or oxidation operations), or portions thereof, can be performed manually. For example, with regard to etching operations, a user can input and specify certain etching-related parameters that can control aspects of an etching operation by the etcher component 102, and, in a semi-automated manner, the etcher component 102 can perform the etching operation on the dielectric material of the substrate component 106, and/or the conductive material of the conductive component 104 thereon, based at least in part on (e.g., in accordance with) the etching-related parameters.

Figure 4:
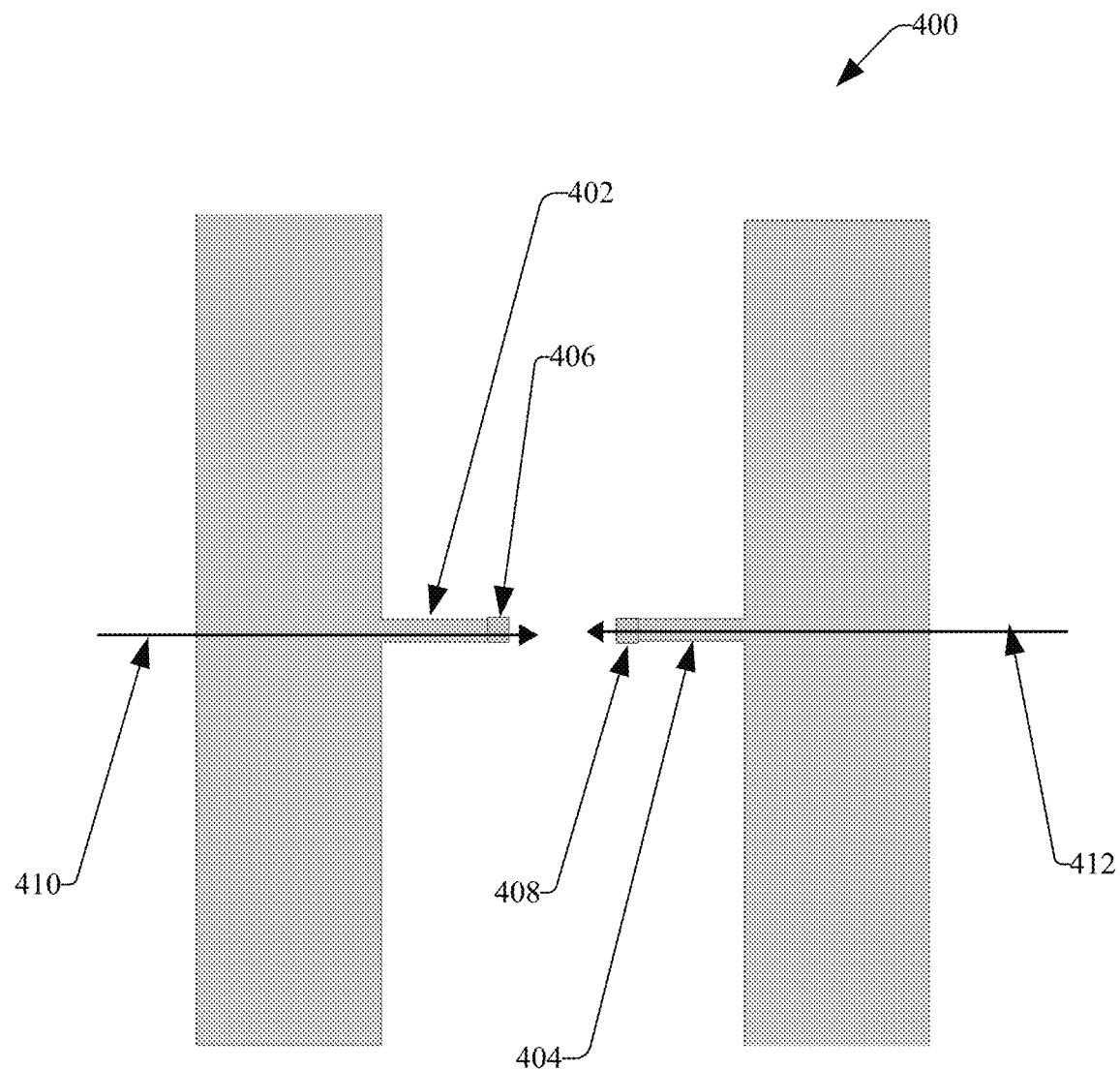
FIG. 4 depicts a diagram of an example, non-limiting dipole of a qubit, with the poles having compensated nub components, wherein a junction component, and electrical leads for connection between circuit components of the regular nub components and the junction component, can be formed, in accordance with various aspects and embodiments of the disclosed subject matter.

Referring to FIG. 4 (along with FIGS. 1 and 3), FIG. 4 depicts a diagram of an example, non-limiting dipole 400 of a qubit, with the poles having compensated nub components, wherein a junction component, and electrical leads for connection between circuit components of the regular nub components and the junction component, can be formed, in accordance with various aspects and embodiments of the disclosed subject matter. The dipole 400 can comprise a first pole 402 and a second pole 404 that can be located across from the first pole 402 with a gap region between them. The first pole 402 can comprise a first compensated nub component 406, and the second pole 404 can comprise a second compensated nub component 408. The etcher component 102 can perform desired material processing operations (e.g., lithography or etching operations) to etch away or otherwise remove a portion of the conductive material of the conductive component 104 and a portion of the underlying dielectric material of the substrate component 106 to form a trench in the dielectric material that can define the first pole 402 and second pole 404. Such formation of the trench also can define the first compensated nub component 406 and the second compensated nub component 408, as well as the circuit components (e.g., capacitor pads, coupling pads, or resonators) that can be formed on or defined by the first nub base portion of the first compensated nub component 406 and the second nub base portion of the second compensated nub component 408.

Since the first pole 402 and second pole 404 each have compensated nub components (e.g., 406, 408), the evaporator component 108 can desirably form the junction component (e.g., Josephson junction) and electrical leads that can connect other circuit components to the junction component by evaporating material (e.g., aluminum or other desired material) in two different directions. In some embodiments, the evaporator component 108 can evaporate (e.g., via a first evaporation) a first portion of the material in a first direction (410) that can correspond to (e.g., be parallel or substantially parallel to) the first pole 402 (e.g., be parallel or substantially parallel to the long or length side of the bridge portion of the first pole 402) and the second pole 404 of the dipole qubit from the first pole 402 towards (e.g., in the direction of) the second pole 404 and associated second compensated nub component 408 at the end of the second pole 404. The first evaporation of the first portion of the material in the first direction (410) can facilitate evaporating or depositing such material on or in proximity to certain areas of the first compensated nub component 406 and second compensated nub component 408. For example, such first evaporation of the first portion of the material in the first direction (410) can facilitate evaporating or depositing such material on or in proximity to certain areas of the first nub base portion and/or the bridge portion of the first compensated nub component 406 that are located in proximity to (e.g., near) the recessed regions (e.g., recessed regions 320 and 322) that face the first evaporation of the first portion of the material. Such first evaporation of the first portion of the material also can facilitate evaporating or depositing such material on or in proximity to certain areas of the second nub base portion and/or the bridge portion of the second compensated nub component 408 that are located in proximity to (e.g., near) the recessed region (e.g., recessed region 324) that faces the first evaporation of the first portion of the material. The first evaporation of the first portion of the material can facilitate forming and/or connecting electrical leads from circuit components (e.g., from capacitor pads, coupling pads, or resonators) associated with the second compensated nub component 408 and/or the first compensated nub component 406 to the junction component that can be formed for the dipole qubit.

The oxidizer component 110 can perform an oxidation operation or process to facilitate forming the junction component (e.g., Josephson junction) for the dipole qubit. For example, subsequent to the performing of the first evaporation of the first portion of the material in the first direction and prior to performing a second evaporation of a second portion of the material in a second direction, the oxidizer component 110 can perform an oxidation operation or process (e.g., oxidation interrupt process) to facilitate forming the junction component, as more fully described herein.

The evaporator component 108 also can evaporate (e.g., via a second evaporation) the second portion of the material in the second direction (412) that can correspond to (e.g., be parallel or substantially parallel to) the second pole 404 (e.g., be parallel or substantially parallel to the long or length side of the bridge portion of the second pole 404) and the first pole 402 of the dipole qubit from the second pole 404 towards (e.g., in the direction of) the first pole 402 and associated first compensated nub component 406 at the end of the first pole 402. The second evaporation of the second portion of the material in the second direction (412) can facilitate evaporating or depositing such material on or in proximity to certain areas of the second compensated nub component 408 and first compensated nub component 406. For example, such second evaporation of the second portion of the material can facilitate evaporating or depositing such material on or in proximity to certain areas of the second nub base portion and/or the bridge portion of the second compensated nub component 408 that are located in proximity to (e.g., near) the recessed regions (e.g., recessed regions 320 and 322) that face the second evaporation of the second portion of the material. Such second evaporation of the second portion of the material also can facilitate evaporating or depositing such material on or in proximity to certain areas of the first nub base portion and/or the bridge portion of the first compensated nub component 406 that are located in proximity to (e.g., near) the recessed region (e.g., recessed region 324) that faces the second evaporation of the second portion of the material. The second evaporation of the second portion of the material can facilitate forming and/or connecting electrical leads from circuit components (e.g., from capacitor pads, coupling pads, or resonators) associated with the first compensated nub component 406 and/or the second compensated nub component 408 to the junction component that can be formed for the dipole qubit.

Figure 5:
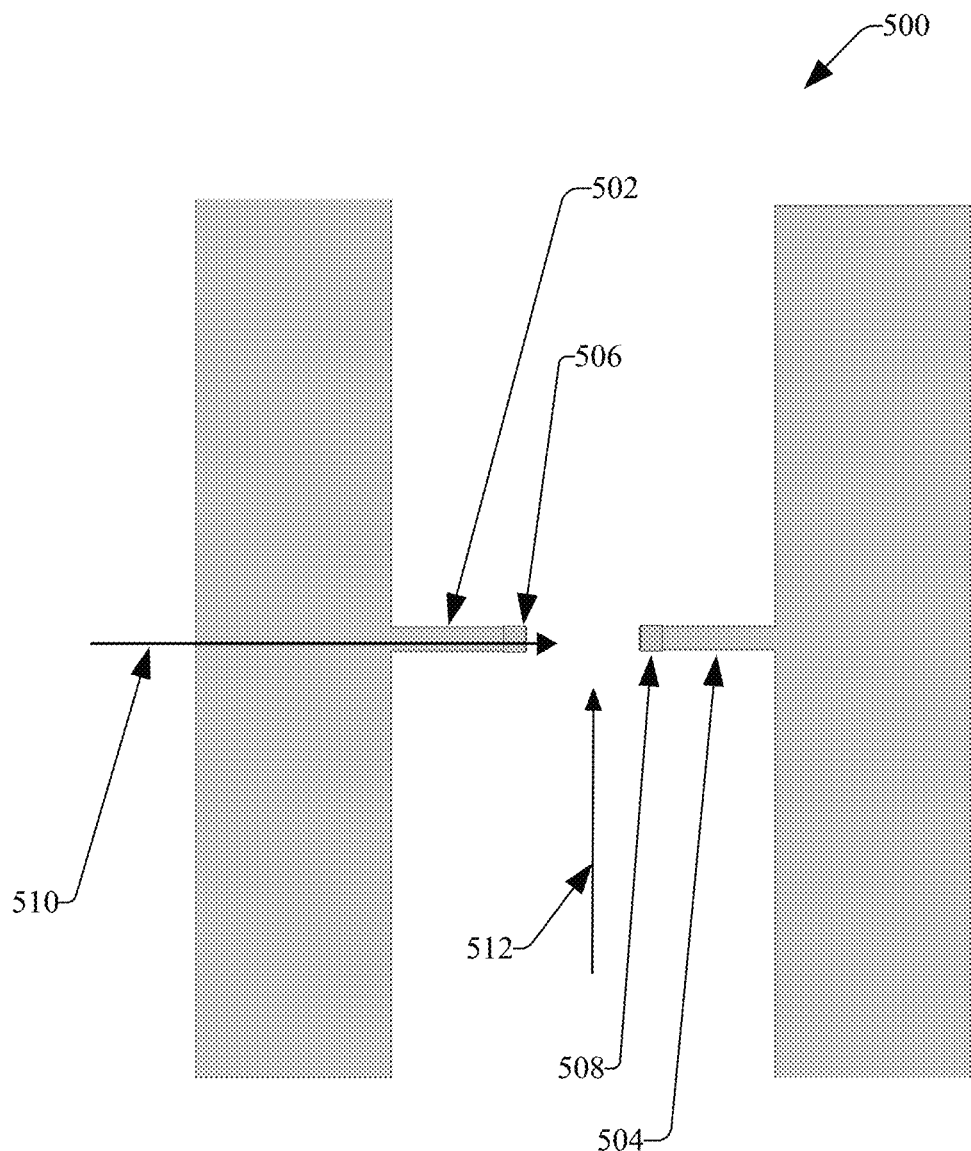
FIG. 5 illustrates a diagram of another example, non-limiting dipole of a qubit, with the poles having compensated nub components, wherein a junction component, and electrical leads for connection between circuit components of the regular nub components and the junction component, can be formed, in accordance with various aspects and embodiments of the disclosed subject matter.

Turning to FIG. 5 (along with FIGS. 1 and 3), FIG. 5 illustrates a diagram of another example, non-limiting dipole 500 of a qubit, with the poles having compensated nub components, wherein a junction component, and electrical leads for connection between circuit components of the regular nub components and the junction component, can be formed, in accordance with various aspects and embodiments of the disclosed subject matter. The dipole 500 can comprise a first pole 502 and a second pole 504 that can be located across from the first pole 502 with a gap region between them. The first pole 502 can comprise a first compensated nub component 506, and the second pole 504 can comprise a second compensated nub component 508. The etcher component 102 can perform desired material processing operations (e.g., lithography or etching operations) to facilitate forming or defining the first pole 502, associated first compensated nub component 506, second pole 504, and associated second compensated nub component 508, as more fully described herein.

The evaporator component 108 can evaporate a first portion of the material in a first direction (510) that can correspond to (e.g., be parallel or substantially parallel to) the first pole 502 (e.g., be parallel or substantially parallel to the long or length side of the bridge portion of the first pole 502) and the second pole 504 of the dipole qubit from the first pole 502 towards (e.g., in the direction of) the second pole 504 and associated second compensated nub component 508 at the end of the second pole 504 in a same or similar manner as described herein, for example, for the dipole 400 of the qubit of FIG. 4 with regard to the first evaporation of the first portion of material in the first direction (410). The first evaporation of the first portion of the material in the first direction (510) can facilitate forming and/or connecting electrical leads from circuit components (e.g., from capacitor pads, coupling pads, or resonators) associated with the second compensated nub component 508 and/or the first compensated nub component 506 to the junction component that can be formed for the dipole qubit.

In some embodiments, subsequent to the performing of the first evaporation of the first portion of the material in the first direction and prior to performing a second evaporation of a second portion of the material in a second direction, the oxidizer component 110 can perform an oxidation operation or process (e.g., oxidation interrupt process) to facilitate forming the junction component in a same or similar manner as described herein, for example, for the dipole 400 of the qubit of FIG. 4 with regard to the oxidation operation or process.

The evaporator component 108 also can evaporate (e.g., via a second evaporation) the second portion of the material on the first compensated nub component 506 and/or second compensated nub component 508 in the second direction (512) that can be perpendicular or substantially perpendicular to, and in proximity to, the first pole 502 and second pole 504 (e.g., be perpendicular or substantially perpendicular to the long or length side of the bridge portions of first pole 502 and second pole 504). The second evaporation of the second portion of the material in the second direction (512) can facilitate evaporating or depositing such material on or in proximity to certain areas of the second compensated nub component 508 and first compensated nub component 506. For example, such second evaporation of the second portion of the material can facilitate evaporating or depositing such material on or in proximity to certain areas of the second nub base portion and/or the bridge portion of the second compensated nub component 508 that are located in proximity to (e.g., near) the recessed regions (e.g., recessed regions 320, 322, and/or 324) and/or that are located in proximity to the sides of the second nub base portion and the bridge portion that face the second evaporation of the second portion of the material in the second direction. Such second evaporation of the second portion of the material also can facilitate evaporating or depositing such material on or in proximity to certain areas of the first nub base portion and/or the bridge portion of the first compensated nub component 506 that are located in proximity to (e.g., near) the recessed regions (e.g., recessed region 320, 322, and/or 324) and/or that are located in proximity to the sides of the first nub base portion and the bridge portion that face the second evaporation of the second portion of the material in the second direction. The second evaporation of the second portion of the material can facilitate forming and/or connecting electrical leads from circuit components (e.g., from capacitor pads, coupling pads, or resonators) associated with the first compensated nub component 506 and/or the second compensated nub component 508 to the junction component that can be formed for the dipole qubit.

Figure 6:
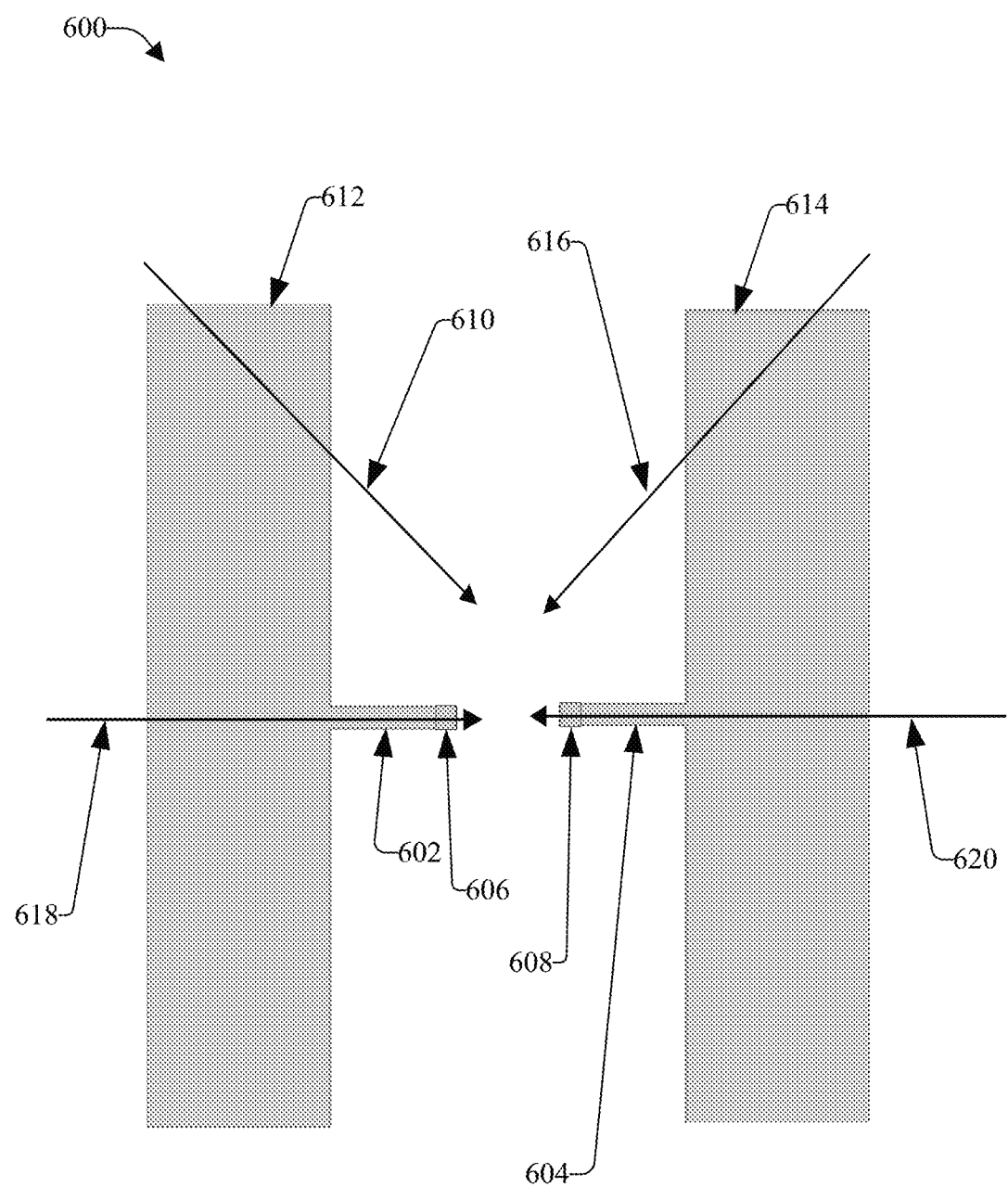
FIG. 6 presents a diagram of an example, non-limiting dipole of a qubit, with the poles having regular nub components, wherein shallow angle evaporation and other evaporations techniques can be employed to facilitate forming a junction component and electrical leads for connection between circuit components of the regular nub components and the junction component, in accordance with various aspects and embodiments of the disclosed subject matter.

Referring to FIG. 6 (along with FIGS. 1 and 2), FIG. 6 presents a diagram of an example, non-limiting dipole 600 of a qubit, with the poles having regular nub components, wherein shallow angle evaporation and other evaporations techniques can be employed to facilitate forming a junction component and electrical leads for connection between circuit components of the regular nub components and the junction component, in accordance with various aspects and embodiments of the disclosed subject matter. The dipole 600 of the qubit can comprise a first pole 602 and a second pole 604. The first pole 602 can comprise a first regular nub component 606 at an exposed end of the first pole 602. The second pole 604 can comprise a second regular nub component 608 at an exposed end of the second pole 604, wherein the exposed end of the second regular nub component 608 can be located in proximity to and/or can face the exposed end of the first regular nub component 606. The etcher component 102 can perform desired material processing operations (e.g., lithography or etching operations) to etch away or otherwise remove a portion of the conductive material of the conductive component 104 and a portion of the underlying dielectric material of the substrate component 106 to form a trench in the dielectric material that can define or form the first pole 602 and second pole 604, define or form the first regular nub component 606 and the second regular nub component 608, and define or form the circuit components (e.g., capacitor pads, coupling pads, or resonators) on the first regular nub component 606 and the second regular nub component 608.

Since the first and second poles 602 and 604 have regular nub components (e.g., 606, 608), to facilitate desirably (e.g., optimally, acceptably, or suitably) forming the junction component and forming and connecting electrical leads between certain circuit components of the qubit and the junction component, the evaporator component 108 can evaporate the material (e.g., aluminum or other desired material) in four distinct directions to facilitate forming the junction component and forming or connecting electrical leads between certain circuit components of the qubit and the junction component. In some embodiments, the evaporator component 108 can evaporate a first portion of the material in a first direction (610) (e.g., at a first angle) with respect to the first regular nub component 606 and second regular nub component 608. For example, the evaporator component 108 can perform shallow angle evaporation to evaporate (e.g., via a first evaporation) the first portion of the material in the first direction (610), which can be at a desired shallow angle (e.g., 45 degrees or less) with respect to a horizontal baseline formed by the extension of the first pole 602 outward from a first base portion 612 of the qubit and the extension of the second pole 604 outward form a second base portion 614 of the qubit, generally from the first base portion side of the qubit towards the second regular nub component 608.

The evaporator component 108 also can evaporate a second portion of the material in a second direction (616) (e.g., at a second angle) with respect to the first regular nub component 606 and second regular nub component 608. For instance, the evaporator component 108 can perform shallow angle evaporation to evaporate (e.g., via a second evaporation) the second portion of the material in the second direction (616), which can be at a desired shallow angle (e.g., 45 degrees or less) with respect to the horizontal baseline associated with the first and second poles 602 and 604, generally from the second base portion side of the qubit towards the first regular nub component 606. The first and second evaporations can facilitate forming and connecting (e.g., contacting) electrical leads from certain circuit components (e.g., capacitor pads, coupling pads, or resonators) to the junction component.

The evaporator component 108 further can evaporate (e.g., via a third evaporation) a third portion of the material in a third direction (618) that can correspond to (e.g., be parallel or substantially parallel to) the first pole 602 (e.g., be parallel or substantially parallel to the long or length side of the bridge portion of the first pole 602) and the second pole 604 of the dipole qubit from the first pole 602 towards (e.g., in the direction of) the second pole 604 and associated second regular nub component 608 at the end of the second pole 604. The third evaporation of the third portion of the material in the third direction (618) can facilitate evaporating or depositing such material on or in proximity to certain areas of the first regular nub component 606 and/or the second regular nub component 608, wherein certain circuit components of the qubit are located. The third evaporation of the third portion of the material, along with the first and second evaporations of the first and second portions of the material, can facilitate forming and/or connecting electrical leads from circuit components (e.g., from capacitor pads, coupling pads, or resonators) associated with the second regular nub component 608 and/or the first regular nub component 606 to the junction component that can be formed for the dipole qubit.

The oxidizer component 110 can perform an oxidation operation or process to facilitate forming the junction component (e.g., Josephson junction) for the dipole qubit. For instance, subsequent to the performing of the third evaporation of the third portion of the material in the third direction (618) and prior to performing a fourth evaporation of a fourth portion of the material in a fourth direction (620), the oxidizer component 110 can perform an oxidation operation or process to facilitate forming the junction component to which electrical leads can be connected, as more fully described herein.

In some embodiments, the evaporator component 108 also can evaporate (e.g., via a fourth evaporation) the fourth portion of the material in the fourth direction (620) that can correspond to (e.g., be parallel or substantially parallel to) the second pole 604 (e.g., be parallel or substantially parallel to the long side of the bridge portion of the second pole 604) and the first pole 602 of the dipole qubit from the second pole 604 towards (e.g., in the direction of) the first pole 602 and associated first regular nub component 606 at the end of the first pole 602. The fourth evaporation of the fourth portion of the material in the fourth direction (620) can facilitate evaporating or depositing such material on or in proximity to certain areas of the first regular nub component 606 and/or the second regular nub component 608 where certain circuit components and the junction component of the qubit are located. The fourth evaporation of the fourth portion of the material can facilitate forming and/or connecting electrical leads from circuit components (e.g., from capacitor pads, coupling pads, or resonators) associated with the first regular nub component 606 and/or the second regular nub component 608 to the junction component formed for the dipole qubit.

Figure 7:
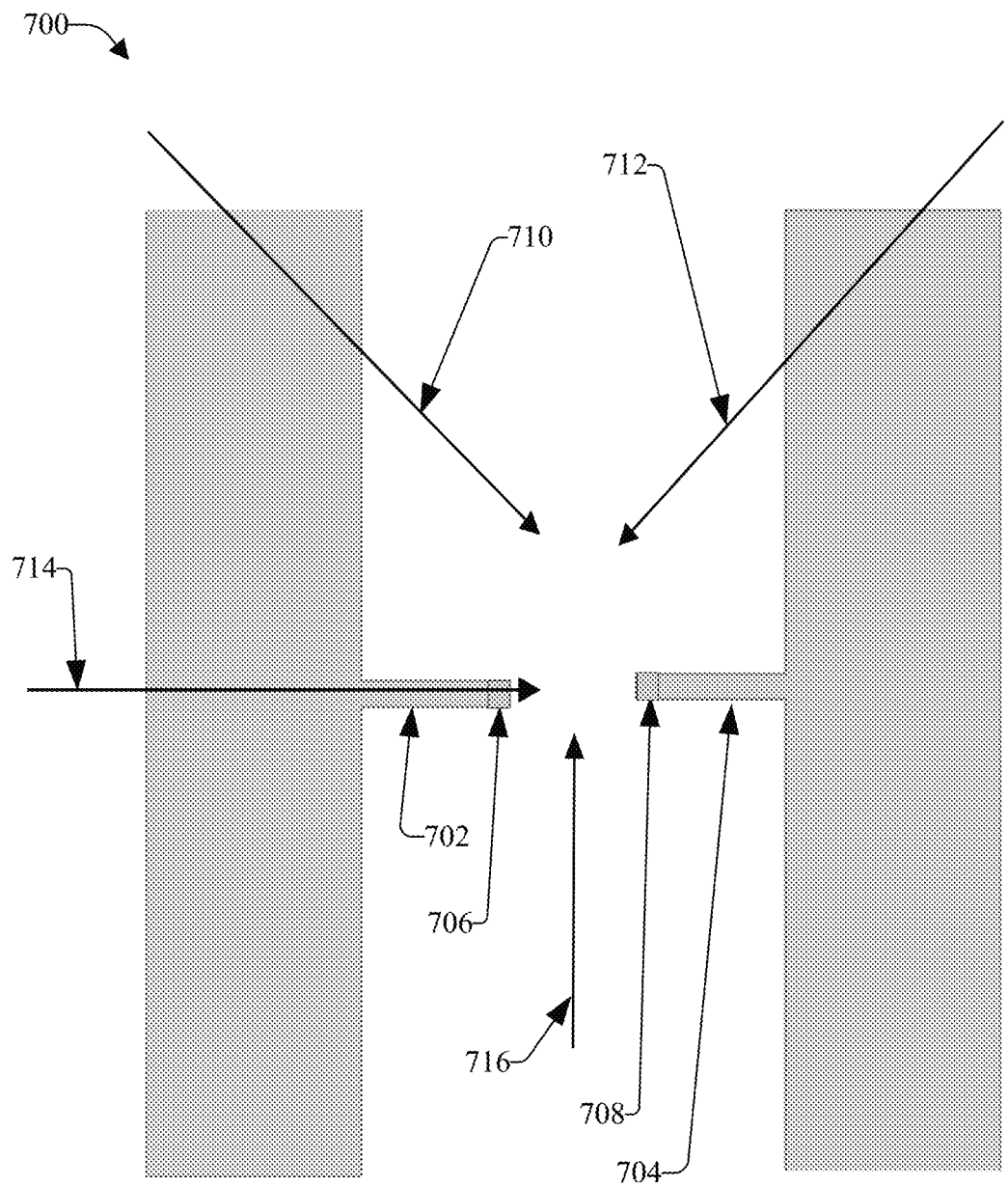
FIG. 7 depicts a diagram of another example, non-limiting dipole of a qubit, with the poles having regular nub components, wherein shallow angle evaporation and other evaporations techniques can be employed to facilitate forming a junction component and electrical leads for connection between circuit components of the regular nub components and the junction component, can be formed, in accordance with various aspects and embodiments of the disclosed subject matter.

Turning to FIG. 7 (along with FIGS. 1 and 2), FIG. 7 depicts a diagram of another example, non-limiting dipole 700 of a qubit, with the poles having regular nub components, wherein shallow angle evaporation and other evaporations techniques can be employed to facilitate forming a junction component and electrical leads for connection between circuit components of the regular nub components and the junction component, can be formed, in accordance with various aspects and embodiments of the disclosed subject matter. The dipole 700 can comprise a first pole 702, second 704, first regular nub component 706 of the first pole 702, and second regular nub component 708 of the second pole 704.

With regard to the dipole 700 of the qubit, the formation of the trench, formation or defining of the poles (e.g., 702, 704), regular nub components (e.g., 706, 708), and certain circuit components (e.g., capacitor pads, coupling pads, or resonators) of the dipole qubit, formation of electrical leads, formation of the junction component, and connection of the electrical leads between the certain circuit components and the junction component can be the same as or similar to such aspects and embodiments as described herein, for example, with regard to the dipole 600 of the qubit for FIG. 6, except that, for the dipole 700, a fourth evaporation of a fourth portion of the material can be in a different direction than the fourth direction of the fourth evaporation of the material described for the dipole 600 of FIG. 6. For instance, with regard to the dipole 700, the evaporator component 108 can evaporate a first portion of the material in a first direction (710), a second portion of the material in a second direction (712), and a third portion of the material in a third direction (714) in a same or similar manner, such as described herein, for example, with regard to the dipole 600 of the qubit for FIG. 6. With further regard to the dipole 700, subsequent to the oxidizer component 110 performing an oxidation operation or process to facilitate forming the junction component (e.g., in the trench) for the dipole qubit, the evaporator component 108 can evaporate (e.g., via a fourth evaporation) a fourth portion of the fourth material in a fourth direction (716) that can be perpendicular or substantially perpendicular to, and in proximity to, the first pole 702 and second pole 704 (e.g., be perpendicular or substantially perpendicular to the long or length side of the bridge portions of first pole 702 and second pole 704) as well as being perpendicular or substantially perpendicular to the third direction (714) of the third evaporation of the third portion of the material with respect to the dipole 700.

The fourth evaporation of the fourth portion of the material in the fourth direction (716) can facilitate evaporating or depositing such material on or in proximity to certain areas of the second regular nub component 708 and/or first regular nub component 706 where the circuit components (e.g., capacitor pads, coupling pads, or resonators) are located. The fourth evaporation of the fourth portion of the material can facilitate forming and/or connecting electrical leads from the circuit components (e.g., from capacitor pads, coupling pads, or resonators) associated with the first regular nub component 706 and/or the second regular nub component 708 to the junction component formed for the dipole qubit.

Figure 8:
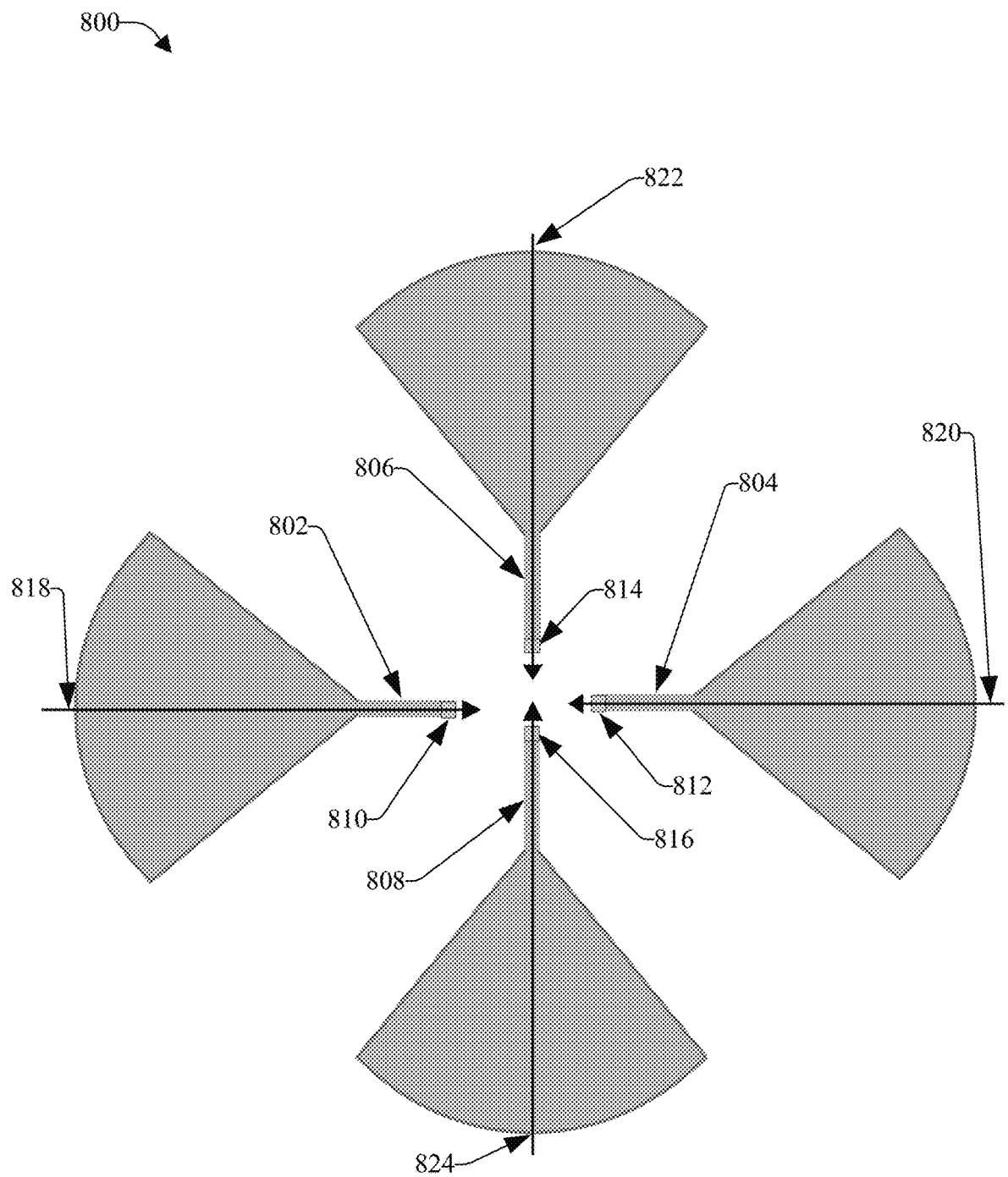
FIG. 8 presents a diagram of an example, non-limiting quadrupole of a qubit, wherein a junction component, and electrical leads for connection between circuit components of the regular nub components and the junction component, can be formed, in accordance with various aspects and embodiments of the disclosed subject matter.

Referring to FIG. 8 (along with FIG. 1), FIG. 8 presents a diagram of an example, non-limiting quadrupole 800 of a qubit, wherein a junction component, and electrical leads for connection between circuit components of the regular nub components and the junction component, can be formed, in accordance with various aspects and embodiments of the disclosed subject matter. In some embodiments, the poles can comprise regular nub components, wherein no trench has been formed. In other embodiments, the poles can comprise compensated nub components, wherein a trench has been formed (e.g., by the etcher component 102) to facilitate defining or forming various circuit components of the qubit, and wherein the trench can have a desired depth (e.g., a depth ranging from 50 nm to 500 nm).

The quadrupole 800 can comprise a first pole 802, second pole 804, third pole 806, and fourth pole 808, wherein the second pole 804 can be located across from the first pole 802, the fourth pole 808 can be located across from the third pole 806. The third pole 806 and fourth pole 808 can be perpendicular or substantially perpendicular to the first pole 802 and second pole 804. The first pole 802 can comprise a first nub component 810, the second pole 804 can comprise a second nub component 812, the third pole 806 can comprise a third nub component 814, and the fourth pole 808 can comprise a fourth nub component 816 that can be located on the ends (e.g., exposed ends) of the poles. The end (e.g., exposed or outward facing end) of the first nub component 810 can be facing and in proximity to the end of the second nub component 812 of the second pole 804. The end (e.g., exposed or outward facing end) of the third nub component 814 can be facing and in proximity to the end of the fourth nub component 816 of the fourth pole 808.

In some embodiments, when no trench has been formed in the qubit, the etcher component 102 can form the nub components (e.g., 810, 812, 814, 816) as regular nub components. In other embodiments, when the etcher component 102 has formed a trench in the qubit, the etcher component 102 can form or define the nub components (e.g., 810, 812, 814, 816) as compensated nub components.

The evaporator component 108 can desirably form the junction component (e.g., Josephson junction) and electrical leads that can connect other circuit components (e.g., capacitor pads, coupling pads, or resonators) to the junction component by evaporating material (e.g., aluminum or other desired material) in four different directions. In some embodiments, the evaporator component 108 can evaporate (e.g., via a first evaporation) a first portion of the material in a first direction (818) that can correspond to (e.g., be parallel or substantially parallel to) the first pole 802 (e.g., be parallel or substantially parallel to the long or length side of the bridge portion of the first pole 802) and the second pole 804 of the quadrupole qubit from the first pole 802 towards (e.g., in the direction of) the second pole 804 and associated second nub component 812 at the end of the second pole 804. The first evaporation of the first portion of the material in the first direction (818) can facilitate evaporating or depositing such material on or in proximity to certain areas of the first nub component 810 and/or second nub component 812. For example, when a trench has been formed and the first and second nub components (e.g., 806, 808) are compensated nub components, such first evaporation of the first portion of the material in the first direction (818) can facilitate evaporating or depositing such material on or in proximity to certain areas of a first nub base portion and/or bridge portion of the first nub component 810 that are located in proximity to (e.g., near) recessed regions (e.g., recessed regions 320 and 322) that face the first evaporation of the first portion of the material. Such first evaporation of the first portion of the material also can facilitate evaporating or depositing such material on or in proximity to certain areas of a second nub base portion and/or bridge portion of the second nub component 812 that are located in proximity to (e.g., near) the recessed region (e.g., recessed region 324) that faces the first evaporation of the first portion of the material. The first evaporation of the first portion of the material can facilitate forming and/or connecting electrical leads from circuit components (e.g., from capacitor pads, coupling pads, or resonators) associated with the second nub component 812 and/or the first nub component 810 to the junction component that can be formed for the quadrupole qubit.

The evaporator component 108 also can evaporate (e.g., via a second evaporation) a second portion of the material in a second direction (820) that can correspond to (e.g., be parallel or substantially parallel to) the second pole 804 (e.g., be parallel or substantially parallel to the long side of the bridge portion of the second pole 804) and the first pole 802 of the quadrupole qubit from the second pole 804 towards (e.g., in the direction of) the first pole 802 and associated first nub component 810 at the end of the first pole 802. The second evaporation of the second portion of the material in the second direction (820) can facilitate evaporating or depositing such material on or in proximity to certain areas (e.g., areas at or in proximity to the location of circuit components) of the second nub component 812 and first nub component 810 in a manner that can be same as or similar to the description with regard to other evaporations of material. The second evaporation of the second portion of the material can facilitate forming and/or connecting electrical leads from circuit components (e.g., from capacitor pads, coupling pads, or resonators) associated with the first nub component 810 and/or the second nub component 812 to the junction component that can be formed for the quadrupole qubit.

The oxidizer component 110 can perform an oxidation operation or process to facilitate forming a junction component (e.g., Josephson junction) for the quadrupole qubit. For example, subsequent to the performing of the second evaporation and prior to performing a third evaporation of a third portion of the material in a third direction, the oxidizer component 110 can perform an oxidation operation or process (e.g., oxidation interrupt process) on a desired portion of the material (e.g., a portion of the material at the bottom of the trench) to facilitate forming the junction component at the bottom of the trench.

The evaporator component 108 also can evaporate (e.g., via a third evaporation) the third portion of the material in the third direction (822) that can correspond to (e.g., be parallel or substantially parallel to) the third pole 806 (e.g., be parallel or substantially parallel to the long side of the bridge portion of the third pole 806) and the fourth pole 808 from the third pole 806 towards (e.g., in the direction of) the fourth pole 808 and associated fourth nub component 816 at the end of the fourth pole 808. The third evaporation of the third portion of the material in the third direction (822) can facilitate evaporating or depositing such material on or in proximity to certain areas (e.g., areas at or in proximity to the location of circuit components) of the fourth nub component 816 and/or third nub component 814 in a manner that can be same as or similar to the description with regard to other evaporations of material. The third evaporation of the third portion of the material can facilitate forming and/or connecting electrical leads from circuit components (e.g., from capacitor pads, coupling pads, or resonators) associated with the fourth nub component 816 and/or the third nub component 814 to the junction component formed for the quadrupole qubit.

The evaporator component 108 further can evaporate (e.g., via a fourth evaporation) a fourth portion of the material in a fourth direction (824) that can correspond to (e.g., be parallel or substantially parallel to) the fourth pole 808 (e.g., be parallel or substantially parallel to the long side of the bridge portion of the fourth pole 808) and the third pole 806 from the fourth pole 808 towards (e.g., in the direction of) the third pole 806 and associated third nub component 814 at the end of the third pole 806. The fourth evaporation of the fourth portion of the material in the fourth direction (824) can facilitate evaporating or depositing such material on or in proximity to certain areas (e.g., areas at or in proximity to the location of circuit components) of the third nub component 814 and/or fourth nub component 816 in a manner that can be same as or similar to the description with regard to other evaporations of material. The fourth evaporation of the fourth portion of the material can facilitate forming and/or connecting electrical leads from circuit components (e.g., from capacitor pads, coupling pads, or resonators) associated with the third nub component 814 and/or the fourth nub component 816 to the junction component.

Figure 9:
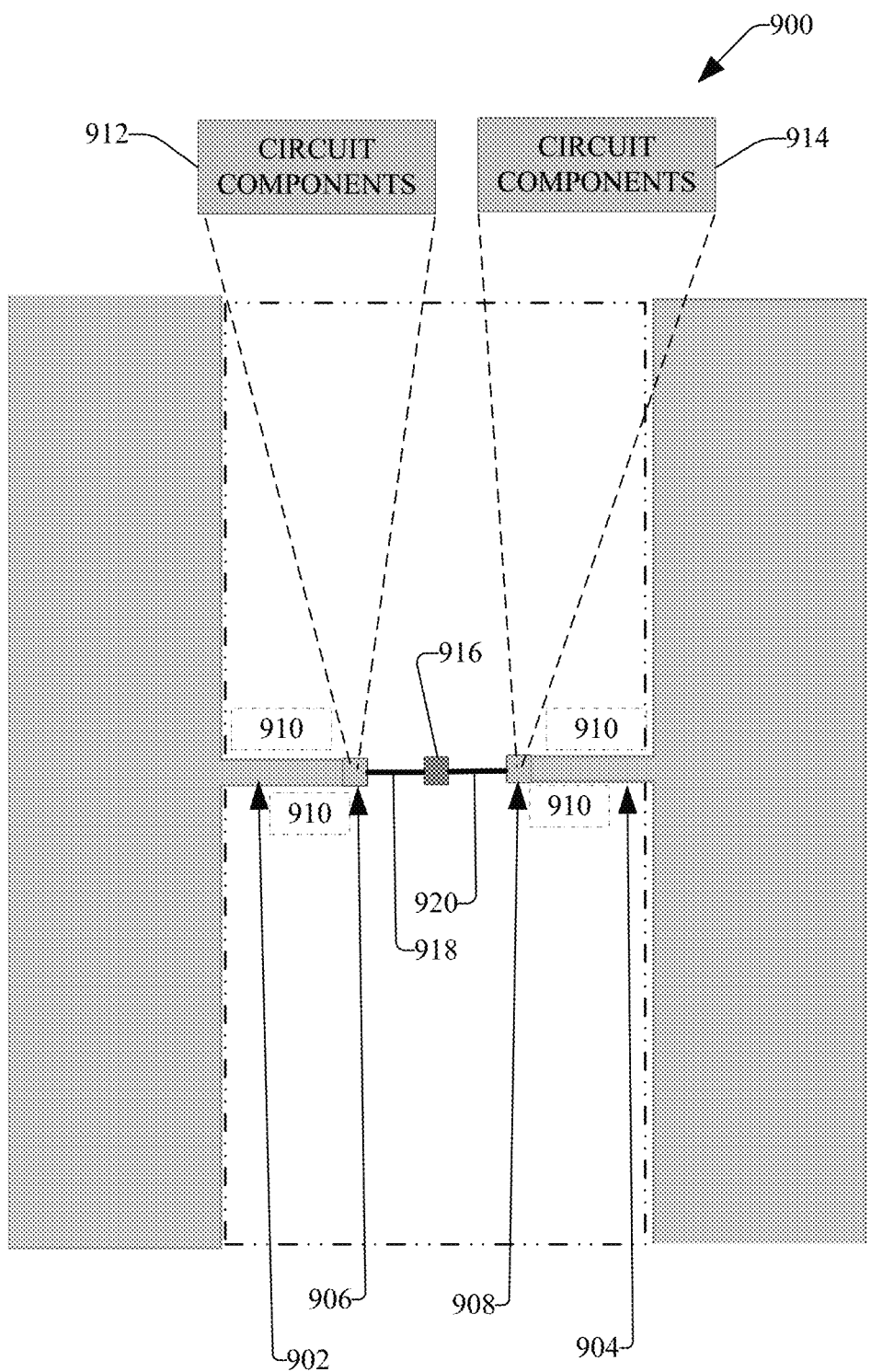
FIG. 9 presents a diagram of an example, non-limiting lead and junction formation of a dipole qubit, in accordance with various aspects and embodiments of the disclosed subject matter.

FIG. 9 presents a diagram of an example, non-limiting lead and junction formation 900 of a dipole qubit, in accordance with various aspects and embodiments of the disclosed subject matter. The lead and junction formation 900 of the dipole qubit can comprise a first pole 902 and second pole 904. A first nub component 906 can be formed (e.g., by the etcher component 102) at an end of the first pole 902, and a second nub component 908 can be formed at an end of the second pole 904, wherein the first pole 902, first nub component 906, second pole 904, and second nub component 908 can be defined by a trench 910 formed (e.g., by the etcher component 102) in the dielectric material via the removal or etching of a desired portion of the dielectric material and a desired portion of the conductive material layered on top of the dielectric material. Employing desired disclosed techniques (e.g., lithography, evaporation, and oxidation techniques), as described herein, the disclosed subject matter (e.g., system 100) can create or define circuit components 912 and 914 on the first nub component 906 and second nub component 908, a junction component 916, electrical lead 918 that can connect circuit component 912 to junction component 916, and electrical lead 920 that can connect circuit component 914 to junction component 916.

Figure 10:
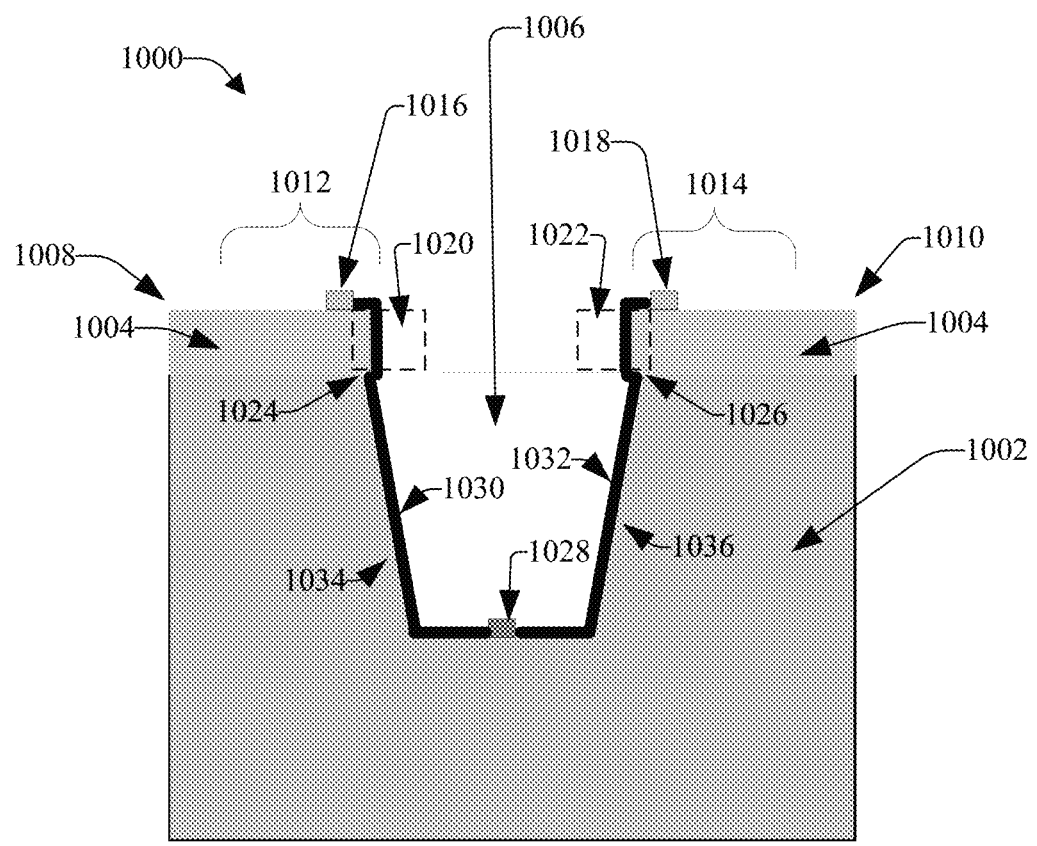
FIG. 10 illustrates a diagram of a side, cross-sectional view of an example, non-limiting lead and junction formation of a dipole qubit, in accordance with various aspects and embodiments of the disclosed subject matter.

FIG. 10 illustrates a diagram of a side, cross-sectional view of an example, non-limiting lead and junction formation 1000 of a dipole qubit, in accordance with various aspects and embodiments of the disclosed subject matter. In the example lead and junction formation 1000, an etching of the dielectric substrate 1002 and the conductive material 1004 applied (e.g., deposited) thereon can be performed (e.g., by the etcher component) to remove a portion of the conductive material 1004 and a portion of the dielectric substrate 1002 to form a trench 1006 in the dielectric substrate 1002. The trench 1006 can define the first pole 1008 and second pole 1010 of the dipole qubit, including defining a first compensated nub component 1012 formed at the end of the first pole 1008 and a second compensated nub component 1014 formed at the end of the second pole 1010, and including defining circuit components 1016 and 1018 (e.g., capacitor pads, coupling pads, or resonators) that can be associated with or part of the first and second compensated nub components 1012 and 1014.

For reasons of clarity, in FIG. 10, some of the extended portions (e.g., 1020 and 1022) of the first and second compensated nub components 1012 and 1014 are shown as dotted lines and other extended portions of the first and second compensated nub components 1012 and 1014 are not shown in FIG. 10. As more fully described herein (e.g., with regard to FIG. 3), due at least in part to the first and second compensated nub components 1012 and 1014 comprising the extended portions (e.g., 1020 and 1022), which can extend from the nub base portions of the first and second compensated nub components 1012 and 1014 and form recessed regions (not shown in FIG. 10), while there is some overhang of the conductive material 1004 that can extend beyond the remaining dielectric material 1002 and over the trench 1006 after the trenching process is performed (as referenced at reference numerals 1024 and 1026), the amount of such overhang (e.g., 1024, 1026) can be significantly less (particularly in proximity to the recessed regions), as compared to the amount of overhang of conductive material when regular nub components are formed (e.g., as shown in, and described herein, with regard to FIGS. 2 and 18).

First and second evaporations of material can be performed in first and second directions (e.g., by the evaporator component), with an oxidation process performed (e.g., by the oxidizer component) in between the first and second evaporations, to form the junction component 1028 (e.g., Josephson junction) and electrical leads 1030 and 1032 that can connect the junction component 1028 to circuit components 1016 and 1018, as more fully described herein. Since the first and second compensated nub components 1012 and 1014 can significantly reduce the amount of overhang (e.g., 1024, 1026), the evaporated material can extend or climb up the side walls 1034 and 1036 of the trench 1006 and can overcome the relatively smaller overhang of the conductive material 1004 (e.g., 1024, 1026) to connect the electrical leads 1030 and 1032 to circuit components 1016 and 1018.

Figure 11:
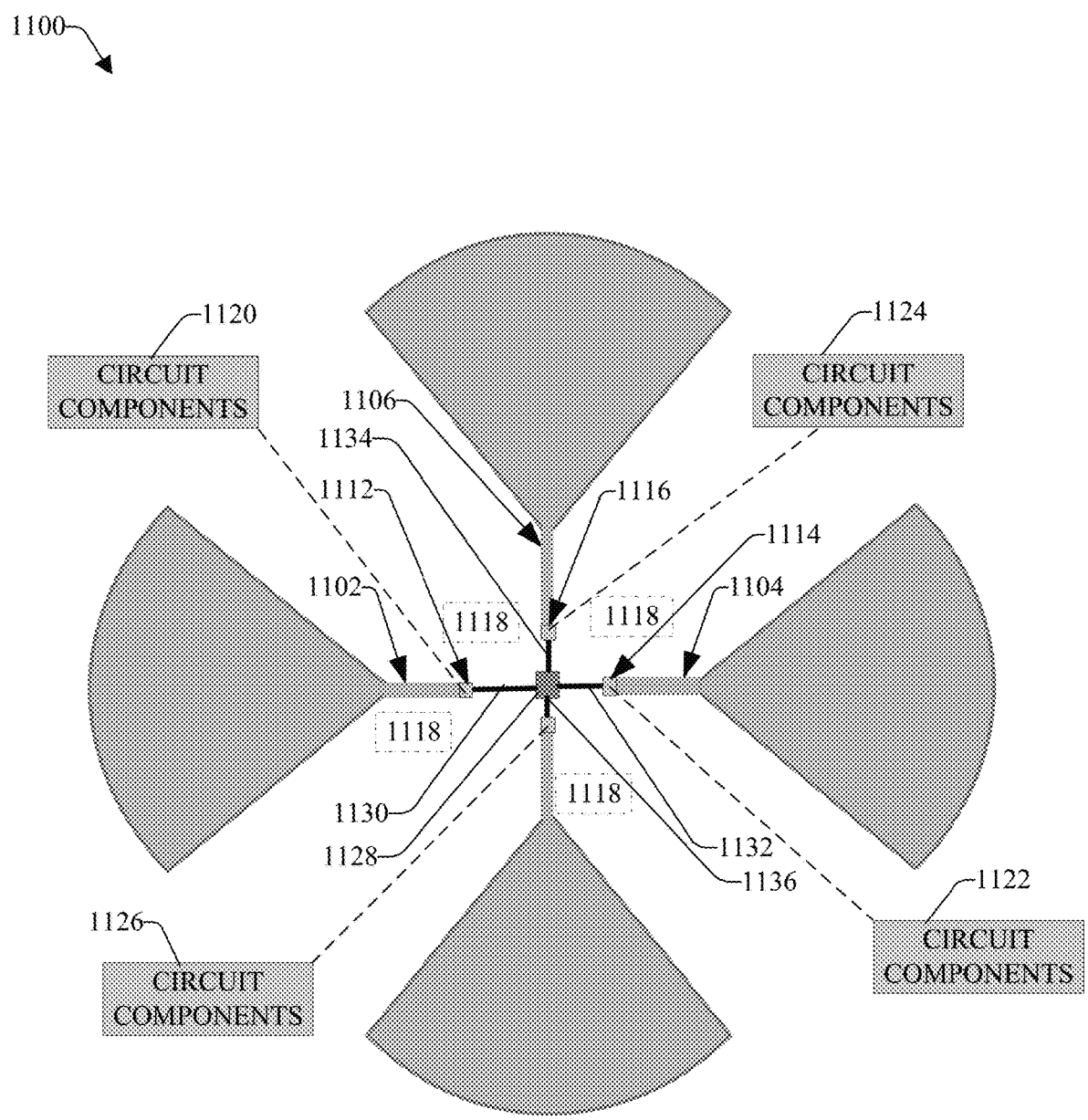
FIG. 11 depicts a diagram of an example, non-limiting lead and junction formation of a quadrupole qubit, in accordance with various aspects and embodiments of the disclosed subject matter.

FIG. 11 depicts a diagram of an example, non-limiting lead and junction formation 1100 of a quadrupole qubit, in accordance with various aspects and embodiments of the disclosed subject matter. The lead and junction formation 1100 of the quadrupole qubit can comprise a first pole 1102, second pole 1104, third pole 1106, and fourth pole 1108. A first nub component 1110 can be formed (e.g., by the etcher component 102) at an end of the first pole 1102, a second nub component 1112 can be formed at an end of the second pole 1104, a third nub component 1114 can be formed at an end of the third pole 1106, and a fourth nub component 1116 can be formed at an end of the fourth pole 1108. The poles (e.g., 1102, 1104, 1106, 1108) and the nub components (e.g., 1110, 1112, 1114, 1116) can be defined by a trench 1118 formed (e.g., by the etcher component 102) in the dielectric material via the removal or etching of a desired portion of the dielectric material and a desired portion of the conductive material layered on top of the dielectric material. Employing desired disclosed techniques (e.g., lithography, evaporation, and oxidation techniques), as described herein, the disclosed subject matter (e.g., system 100) can create or define circuit components (e.g., 1120, 1122, 1124, 1126), such as, for example, capacitor pads, coupling pads, or resonators, on the nub components (e.g., 1110, 1112, 1114, 1116), a junction component 1128, electrical lead 1130 that can connect circuit component 1120 to junction component 1128, electrical lead 1132 that can connect circuit component 1122 to junction component 1128, electrical lead 1134 that can connect circuit component 1124 to junction component 1128, and electrical lead 1136 that can connect circuit component 1126 to junction component 1128.

Figure 12:
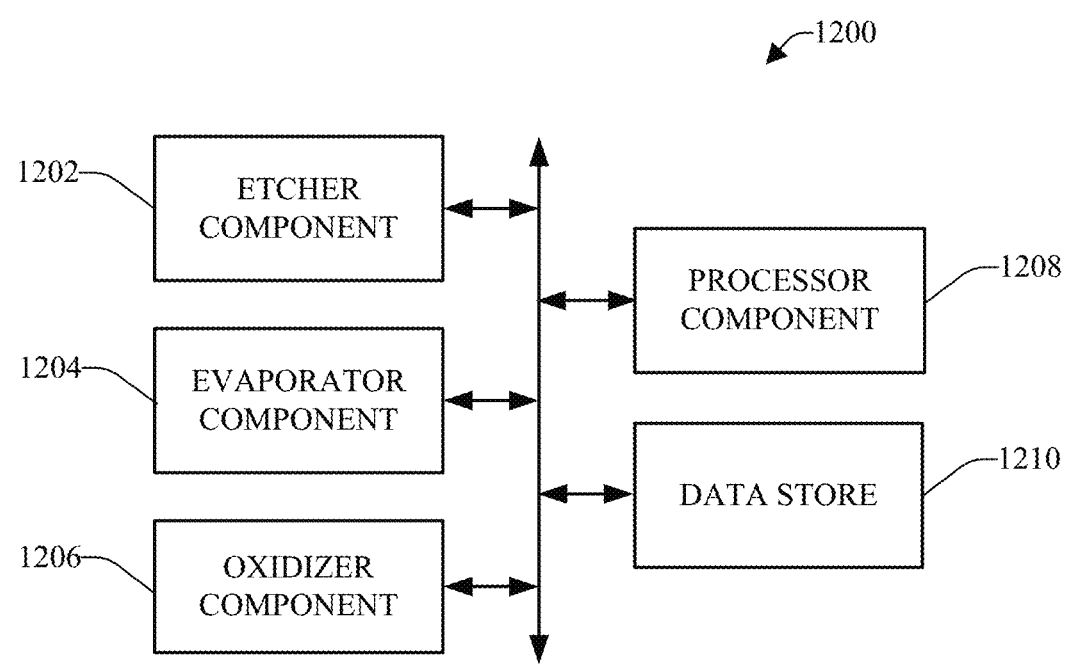
FIG. 12 illustrates a block diagram of another example, non-limiting system that can be utilized to efficiently form electrical leads and junction components for qubits of a quantum circuit, in accordance with various aspects and embodiments of the disclosed subject matter.

FIG. 12 illustrates a block diagram of another example, non-limiting system 1200 that can be utilized to efficiently form electrical leads and junction components for qubits of a quantum circuit, in accordance with various aspects and embodiments of the disclosed subject matter. The system 1200 can comprise an etcher component 1202, an evaporator component 1204, and an oxidizer component 1206 that each can be the same as or similar to, and/or can comprise the same or similar functionality as, respective components (e.g., respectively named components), as more fully described herein.

The system 1200 can include an operations manager component 1208 that can control (e.g., manage) operations associated with the system 1200. For example, the operations manager component 1208 can facilitate generating instructions to have components of the system 1200 perform operations, and can communicate instructions to components (e.g., etcher component 1202, evaporator component 1204, oxidizer component 1206, processor component 1210, data store 1212, . . . ) of the system 1200 to facilitate performance of operations by the components of the system 1200 based at least in part on the instructions, in accordance with the defined circuit design criteria, defined circuit design algorithms (e.g., circuit design algorithms as disclosed, defined, recited, embodied or indicated herein by the methods, systems, and techniques described herein). The operations manager component 1208 also can facilitate controlling data flow between the components of the system 1200 and controlling data flow between the system 1200 and another system(s), component(s), or device(s) (e.g., computer, laptop computer, or other type of computing and/or communication device; quantum or electronic circuit fabricating device or system) associated with (e.g., connected to) the system 1200.

The processor component 1210 can work in conjunction with the other components (e.g., etcher component 1202, evaporator component 1204, oxidizer component 1206, operations manager component 1208, and/or data store 1212, . . . ) to facilitate performing the various functions of the system 1200. The processor component 1210 can employ one or more processors, microprocessors, or controllers that can process data, such as information relating to applications, qubits, material processing processes or techniques, evaporation processes or techniques, oxidation processes or techniques, circuit formation processes or techniques, junction formation processes or techniques, defined circuit design criteria, defined circuit design algorithms, traffic flows, policies, protocols, interfaces, tools, and/or other information, to facilitate operation of the system 1200, as more fully disclosed herein, and control data flow between the system 1200 and other components (e.g., computer, laptop computer, or other computing or communication device; quantum or electronic circuit fabricating device or system) associated with (e.g., connected to) the system 1200.

The data store 1212 can store data structures (e.g., user data, metadata), code structure(s) (e.g., modules, objects, hashes, classes, procedures) or instructions, information relating to applications, qubits, material processing processes or techniques, evaporation processes or techniques, oxidation processes or techniques, circuit formation processes or techniques, junction formation processes or techniques, defined circuit design criteria, defined circuit design algorithms, traffic flows, policies, protocols, interfaces, tools, and/or other information, to facilitate controlling operations associated with the system 1200. In an aspect, the processor component 1210 can be functionally coupled (e.g., through a memory bus) to the data store 1212 in order to store and retrieve information desired to operate and/or confer functionality, at least in part, to the etcher component 1202, evaporator component 1204, oxidizer component 1206, operations manager component 1208, and/or data store 1212, etc., and/or substantially any other operational aspects of the system 1200.

Figure 13:
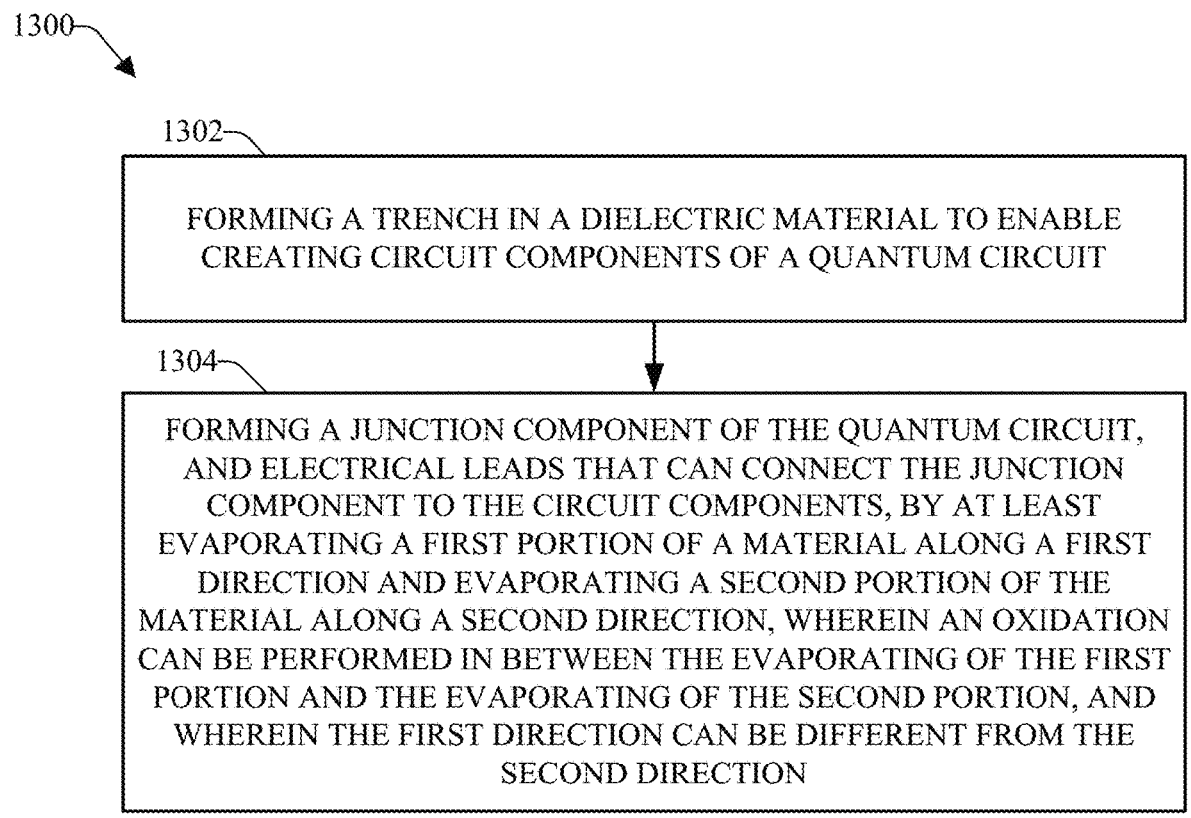
FIG. 13 illustrates a flow diagram of an example, non-limiting method for forming a junction component and electrical leads that connect the junction component to circuit components of a qubit of a quantum circuit, in accordance with various aspects and embodiments of the disclosed subject matter.

FIG. 13 illustrates a flow diagram of an example, non-limiting method 1300 for forming a junction component and electrical leads that connect the junction component to circuit components of a qubit of a quantum circuit, in accordance with various aspects and embodiments of the disclosed subject matter. The method 1300 can be performed by, for example, an etcher component, evaporator component, oxidizer component, and/or a processor component. Repetitive description of like elements employed in other embodiments described herein is or may be omitted for sake of brevity.

At 1302, a trench can be formed in a dielectric material to enable creating circuit components of a quantum circuit. A dielectric material (e.g., dielectric substrate) can have a conductive material (e.g., superconducting material) applied or deposited on a surface (e.g., top surface) of the dielectric material. The etcher component can etch or otherwise remove a portion of the conductive material and a portion of the dielectric material (e.g., underneath the portion of the conductive material) to form the trench in the dielectric material to enable creating the circuit components of a qubit of the quantum circuit. The removal of the portion of the conductive material and the portion of the dielectric material to form the trench can define or form the poles (e.g., two poles, or four poles) of the qubit, nub components (e.g., regular or compensated nub components) of the poles, and certain circuit components, including, for example, resonators, coupling pads, and/or capacitor pads associated with the qubit.

At 1304, a junction component of the quantum circuit, and electrical leads that can connect the junction component to the circuit components, can be formed by at least evaporating a first portion of a material along a first direction and evaporating a second portion of the material along a second direction, wherein an oxidation can be performed in between the evaporating of the first portion and the evaporating of the second portion, and wherein the first direction can be different from the second direction. The evaporator component and oxidizer component can be utilized to form the junction component and the electrical leads that can connect the junction component to the circuit components of the qubit. The evaporator component can at least evaporate a first portion of a material (e.g., aluminum or other desired material) along a first direction and evaporate a second portion of the material along a second direction, wherein the oxidizer component can perform an oxidation operation in between the evaporating of the first portion and the evaporating of the second portion to form the junction component, and wherein the first direction can be different from the second direction (e.g., opposite or perpendicular to the first direction). The number of evaporations (e.g., two or four) of the material and the number of directions (e.g., two or four) in which the evaporations of the material are performed, and the timing of the performance of the oxidation (e.g., oxidation operation) in relation to the performing of the two or four evaporations of the material, can be based at least in part on whether a compensated nub component or a regular nub component is formed on the poles in connection with the forming of the trench, and the number of poles (e.g., dipole or higher order poles) associated with the qubit, as more fully described herein.

Figure 14:
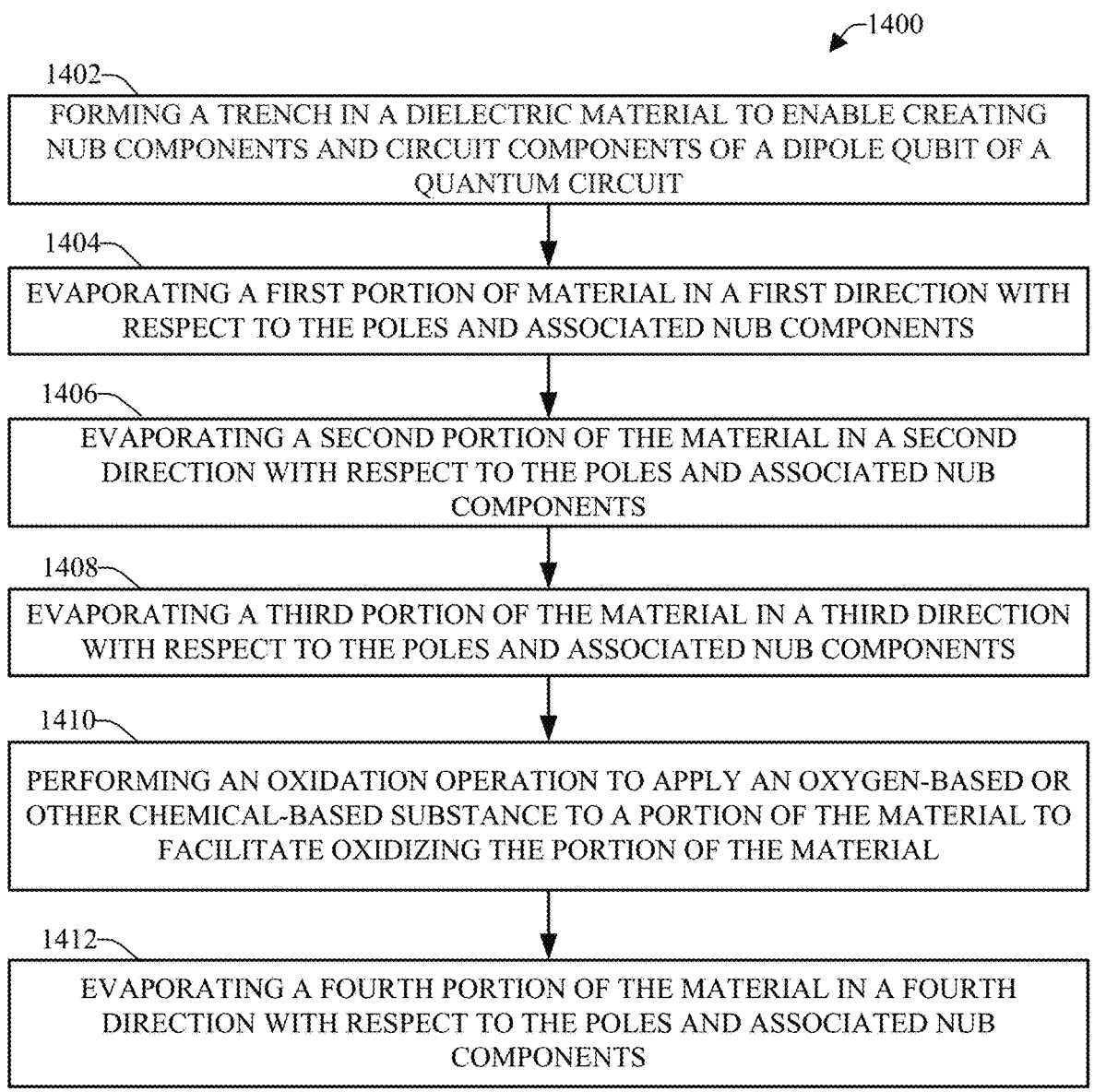
FIG. 14 depicts a flow diagram of an example, non-limiting method for fabricating electrical leads and a junction component associated with a dipole qubit with regard to a regular nub implementation, in accordance with various aspects and embodiments of the disclosed subject matter.

FIG. 14 depicts a flow diagram of an example, non-limiting method 1400 for fabricating electrical leads and a junction component associated with a dipole qubit with regard to a regular nub implementation, in accordance with various aspects and embodiments of the disclosed subject matter. The method 1400 can be performed by, for example, an etcher component, evaporator component, oxidizer component, and/or a processor component. Repetitive description of like elements employed in other embodiments described herein is or may be omitted for sake of brevity.

At 1402, a trench can be formed in a dielectric material to enable creating nub components and circuit components of a dipole qubit of a quantum circuit. A dielectric material (e.g., dielectric substrate) can have a conductive material (e.g., superconducting material) applied or deposited on a surface (e.g., top surface) of the dielectric material. The etcher component can etch or otherwise remove a portion of the conductive material and a portion of the dielectric material (e.g., underneath the portion of the conductive material) to form the trench in the dielectric material to enable creating or defining the poles of the dipole qubit, including the nub components (e.g., regular nub components) and the circuit components of the qubit, wherein each of the nub components can be formed at the end of each of the poles of the qubit. The removal of the portion of the conductive material and the portion of the dielectric material to form the trench can define the poles, including the nub components, and can define certain circuit components, including, resonators, coupling pads, and/or capacitor pads that can be formed on the nub components. In some embodiments, a nub component of a pole can be a regular nub component, as more fully described herein, and can have a defined shape (e.g., rectangular) and defined size.

At 1404, a first portion of material can be evaporated in a first direction with respect to the poles and associated nub components. The evaporator component can evaporate the first portion of the material (e.g., aluminum or other desired material) in the first direction (e.g., at a desired first angle) with respect to the poles and associated nub components. In some embodiments, the evaporator component can perform shallow angle evaporation to evaporate the first portion of the material at the desired first angle, which can be a relatively shallow angle (e.g., an angle of 45 degrees or approximately 45 degrees, or less), with respect to the poles (e.g., with respect to the nub components of such poles) to facilitate forming the electrical leads and contacting the electrical leads from circuit components of the nub components to a junction component (e.g., Josephson junction).

At 1406, a second portion of the material can be evaporated in a second direction with respect to the poles and associated nub components. The evaporator component can evaporate the second portion of the material in the second direction (e.g., at a desired second angle) with respect to the poles and associated nub components. In some embodiments, the evaporator component can perform shallow angle evaporation to evaporate the second portion of the material at the desired second angle, which can be a relatively shallow angle, with respect to the poles and associated nub components to facilitate forming the electrical leads and contacting the electrical leads from the circuit components of the nub components to the Josephson junction. In certain embodiments, the second direction can be perpendicular or substantially perpendicular to the first direction.

At 1408, a third portion of the material can be evaporated in a third direction with respect to the poles and associated nub components. The evaporator component can evaporate the third portion of the material in the third direction with respect to the poles and associated nub components, wherein, for example, the third direction can correspond to (e.g., be parallel or substantially parallel to) the poles of the qubit from the first pole towards (e.g., in the direction of) the second pole and associated second nub component at the end of the second pole, as more fully described herein.

At 1410, an oxidation operation can be performed to apply an oxygen-based or other chemical-based substance to a portion of the material to facilitate oxidizing the portion of the material. The oxidizer component can perform such oxidation operation to facilitate oxidizing the portion of the material and forming the junction component in the bottom of the trench.

At 1412, a fourth portion of the material can be evaporated in a fourth direction with respect to the poles and associated nub components. The evaporator component can evaporate the fourth portion of the material in the fourth direction with respect to the poles and associated nub components. In some embodiments, the evaporator component can evaporate the fourth portion of the material in a direction (e.g., the fourth direction) that can correspond to (e.g., be parallel or substantially parallel to) the poles of the qubit from the second pole towards (e.g., in the direction of) the first pole and associated first nub component at the end of the first pole (e.g., in an opposite direction or substantially opposite direction than the third direction) to facilitate forming the electrical leads and contacting the electrical leads from circuit components of the nub components to the junction component. In other embodiments, alternatively, the evaporator component can evaporate the fourth portion of the material in a fourth direction that can be perpendicular or substantially perpendicular to the third direction.

Figure 15:
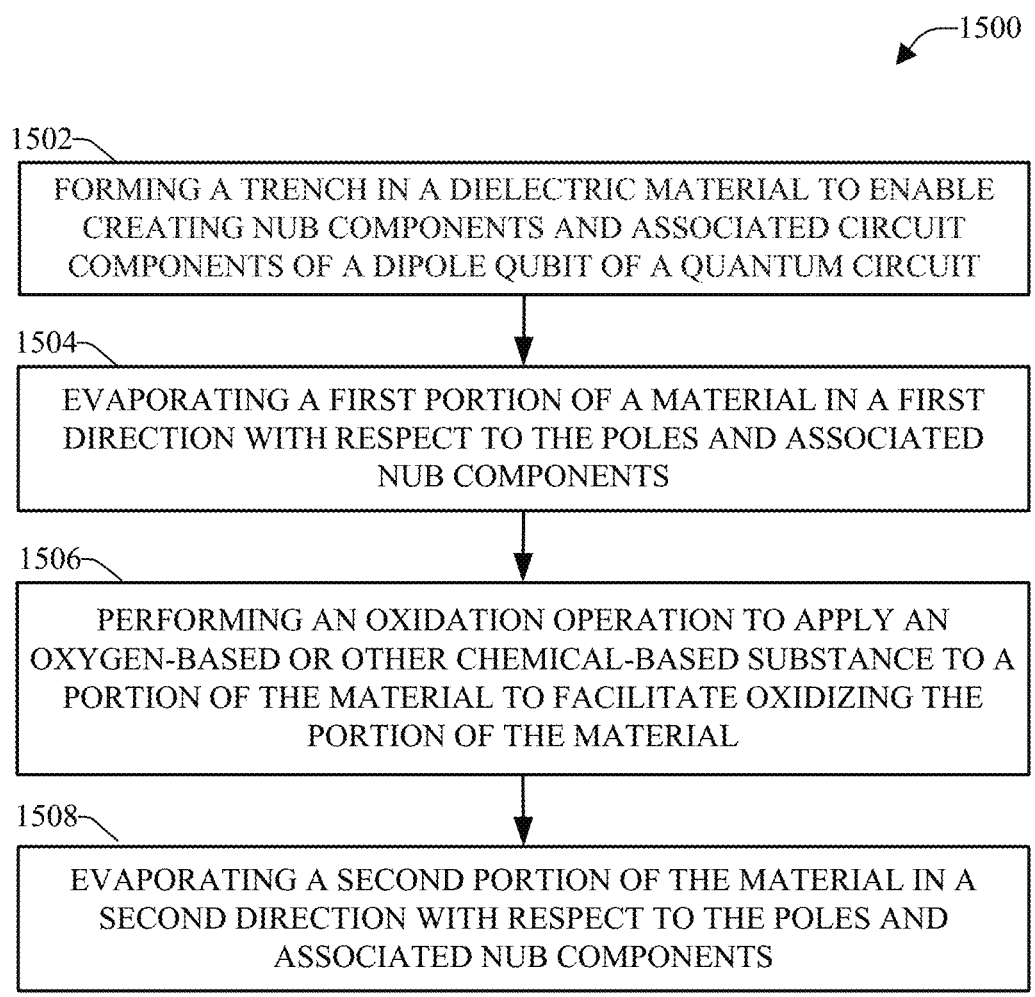
FIG. 15 presents a flow diagram of an example, non-limiting method for fabricating electrical leads and a junction component associated with a dipole qubit with regard to a compensated nub implementation, in accordance with various aspects and embodiments of the disclosed subject matter.

FIG. 15 presents a flow diagram of an example, non-limiting method 1500 for fabricating electrical leads and a junction component associated with a dipole qubit with regard to a compensated nub implementation, in accordance with various aspects and embodiments of the disclosed subject matter. The method 1500 can be performed by, for example, an etcher component, evaporator component, oxidizer component, and/or a processor component. Repetitive description of like elements employed in other embodiments described herein is or may be omitted for sake of brevity.

At 1502, a trench can be formed in a dielectric material to enable creating nub components and associated circuit components of a dipole qubit of a quantum circuit. A dielectric material (e.g., dielectric substrate) can have a conductive material (e.g., superconducting material) applied or deposited on the dielectric material. The etcher component can etch or otherwise remove a portion of the conductive material and a portion of the dielectric material to form the trench in the dielectric material to enable creating the poles of the dipole qubit, including the nub components, and the circuit components of the quantum circuit, wherein each of the nub components can be formed at the end of each of the poles of the dipole qubit. The removal of the portion of the conductive material and the portion of the dielectric material to form the trench can define the nub components and certain circuit components (e.g., resonators, coupling pads, or capacitor pads) that can be formed on the nub components.

In some embodiments, a nub component of a pole can be a compensated nub component, as more fully described herein.

At 1504, a first portion of a material can be evaporated in a first direction with respect to the poles and associated nub components. The evaporator component can evaporate the first portion of the material (e.g., aluminum or other desired material) in the first direction with respect to the poles and associated nub components. The first direction can correspond to (e.g., be parallel or substantially parallel to) the poles of the qubit from the first pole towards (e.g., in the direction of) the second pole and second compensated nub component of the second pole to facilitate forming the electrical leads and contacting the electrical leads from circuit components of the nub components to a junction component.

At 1506, an oxidation operation can be performed to apply an oxygen-based or other chemical-based substance to a portion of the material to facilitate oxidizing the material. The oxidizer component can perform such oxidation operation to facilitate oxidizing the portion of the material and forming the junction component (e.g., Josephson junction) in the bottom of the trench.

At 1508, a second portion of the material can be evaporated in a second direction with respect to the poles and associated nub components. The evaporator component can evaporate the second portion of the material in the second direction with respect to the poles and associated nub components. In some embodiments, the evaporator component can evaporate the second portion of the material in a direction (e.g., the second direction) that can correspond to (e.g., be parallel or substantially parallel to) the poles of the qubit from the second pole towards (e.g., in the direction of) the first pole and associated first compensated nub component at the end of the first pole (e.g., in an opposite or substantially opposite direction than the first direction) to facilitate forming the electrical leads and contacting the electrical leads from circuit components of the nub components to the junction component. In other embodiments, alternatively, the evaporator component can evaporate the second portion of the material in a direction (e.g., the second direction) that can be perpendicular or substantially perpendicular to the first direction.

Figure 16:
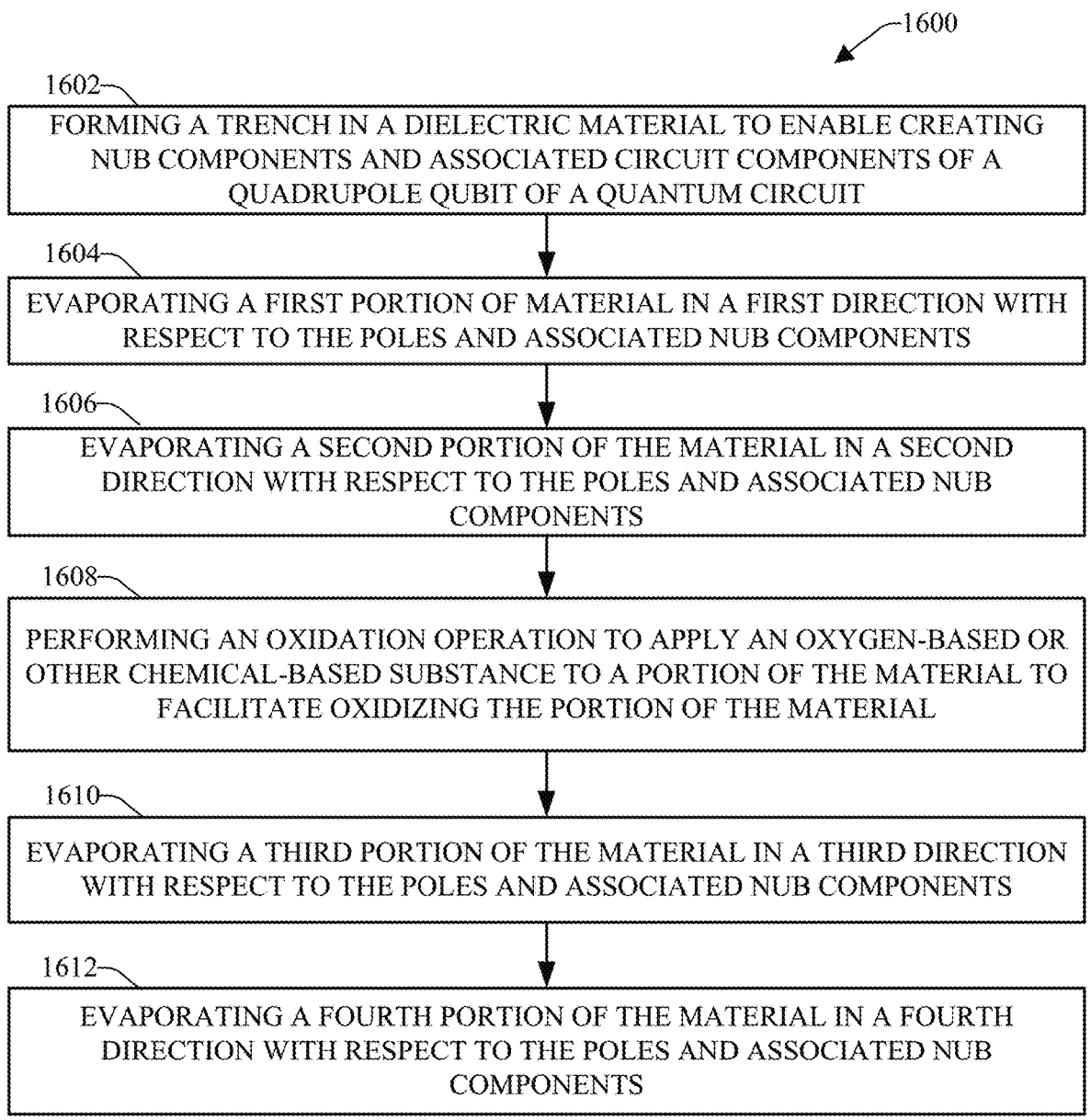
FIG. 16 illustrates a flow diagram of an example, non-limiting method for fabricating electrical leads and a junction component associated with a quadrupole qubit with regard to a compensated nub implementation, in accordance with various aspects and embodiments of the disclosed subject matter.

FIG. 16 illustrates a flow diagram of an example, non-limiting method 1600 for fabricating electrical leads and a junction component associated with a quadrupole qubit with regard to a compensated nub implementation, in accordance with various aspects and embodiments of the disclosed subject matter. The method 1600 can be performed by, for example, an etcher component, evaporator component, oxidizer component, and/or a processor component. Repetitive description of like elements employed in other embodiments described herein is or may be omitted for sake of brevity.

At 1602, a trench can be formed in a dielectric material to enable creating nub components and associated circuit components of a quadrupole qubit of a quantum circuit. A dielectric material (e.g., dielectric substrate) can have a conductive material (e.g., superconducting material) applied or deposited on a surface (e.g., top surface) of the dielectric material. The etcher component can etch or otherwise remove a portion of the conductive material and a portion of the dielectric material to form the trench in the dielectric material to enable creating the poles (e.g., four poles) of the qubit, including the nub components (e.g., compensated nub components) and associated circuit components of the quantum circuit, wherein each of the nub components can be formed at the end of each of the poles. The configuration of the poles in relation to each other can be a quadrupole configuration, such as described herein. The removal of the portion of the conductive material and the portion of the dielectric material to form the trench can form or define the nub components and certain circuit components, such as resonators, coupling pads, and capacitor pads, that can be formed on the nub components.

At 1604, a first portion of material can be evaporated in a first direction with respect to the poles and associated nub components. The evaporator component can evaporate the first portion of the material (e.g., aluminum or other desired material) in the first direction with respect to the poles and associated nub components. The first direction can correspond to (e.g., be parallel or substantially parallel to) the first and second poles from the first pole (and associated first nub component) towards (e.g., in the direction of) the second pole and associated second nub component at the end of the second pole.

At 1606, a second portion of the material can be evaporated in a second direction with respect to the poles and associated nub components. The evaporator component can evaporate the second portion of the material in the second direction with respect to the poles and associated nub components. The second direction can correspond to (e.g., be parallel or substantially parallel to) the first and second poles of the qubit from the second pole towards (e.g., in the direction of) the first pole and associated first nub component at the end of the first pole (e.g., in an opposite or substantially opposite direction than the first direction).

At 1608, an oxidation operation can be performed to apply an oxygen-based or other chemical-based substance to a portion of the material to facilitate oxidizing the portion of the material. The oxidizer component can perform such oxidation operation to facilitate oxidizing the material to form the junction component (e.g., Josephson junction) at the bottom of the trench.

At 1610, a third portion of the material can be evaporated in a third direction with respect to the poles and associated nub components. The evaporator component can evaporate the third portion of the material in the third direction with respect to the poles and associated nub components. The third direction can correspond to (e.g., be parallel or substantially parallel to) the third and fourth poles of the qubit from the third pole towards (e.g., in the direction of) the fourth pole and associated fourth nub component at the end of the fourth pole.

At 1612, a fourth portion of the material can be evaporated in a fourth direction with respect to the poles and associated nub components. The evaporator component can evaporate the fourth portion of the material in the fourth direction with respect to the poles and associated nub components. The fourth direction can correspond to (e.g., be parallel or substantially parallel to) the third and fourth poles of the qubit from the fourth pole (and associated fourth nub component) towards (e.g., in the direction of) the third pole and associated third nub component at the end of the third pole (e.g., in an opposite direction or substantially opposite direction than the third direction).

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 17:
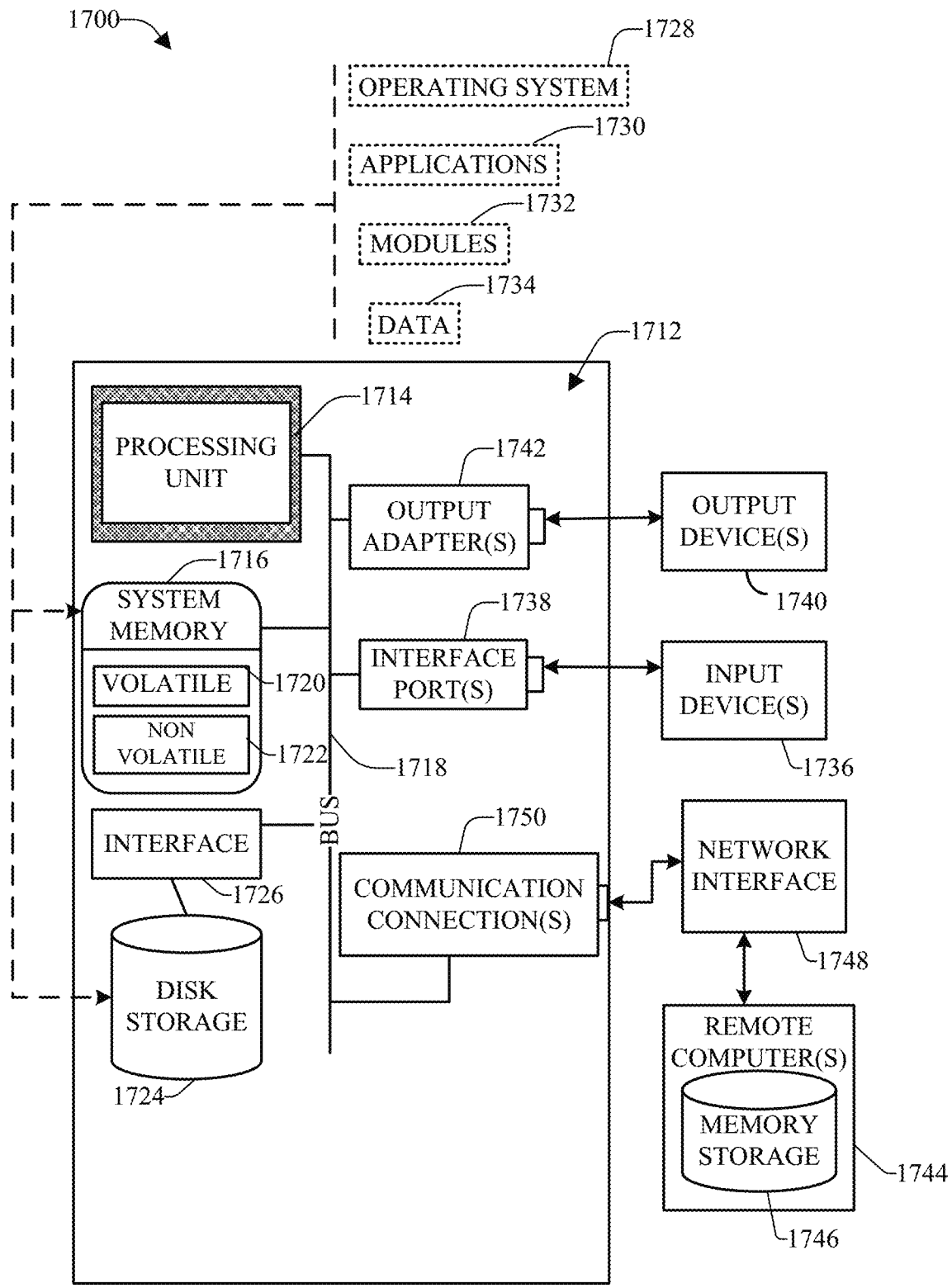
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is or may be omitted for sake of brevity. With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a method of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, magnetic storage device, optical storage device, electromagnetic storage device, semiconductor storage device, or any suitable combination of the foregoing. A non-exhaustive list of more specific examples of the computer readable storage medium can include the following: a portable computer diskette, hard disk, RAM, ROM, erasable programmable read-only memory (EPROM or Flash memory), SRAM, portable compact disc read-only memory (CD-ROM), digital versatile disk (DVD), memory stick, floppy disk, mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations.

That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM)). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above includes mere examples of systems and computer-implemented methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, comprising:
    forming a trench in a dielectric material to enable creating circuit components of a circuit in the trench; and
    forming a Josephson junction component of the circuit, and electrical leads that connect the circuit components to the junction component, by evaporating a first portion of a material along a first direction and evaporating a second portion of the material along a second direction, wherein an oxidation is performed in between the evaporating of the first portion and the evaporating of the second portion, and wherein the first direction is different from the second direction.

2. The method of forming a semiconductor device of claim 1, wherein the forming the Josephson junction component and the electrical leads that connect the circuit components to the Josephson junction component are performed during a single fabrication operation.

3. The method of forming a semiconductor device of claim 1, wherein the circuit components are selected from a group consisting of capacitor pads, coupling pads, and resonators created on a conductive material associated with the dielectric material, and wherein the forming the trench further comprises forming the trench and creating the circuit components in a single lithography operation.

4. The method of forming a semiconductor device of claim 1, further comprising: based on the formation of the trench, forming a first pole and a second pole, wherein the first pole comprises a first nub component at an end of the first pole, and the second pole comprises a second nub component at an end of the second pole.

5. The method of forming a semiconductor device of claim 4, further comprising:
    forming the first nub component comprising extended portions that extend away from a nub base portion of the first nub component, wherein the extended portions are arranged in relation to each other or in relation to a bridge portion of the first pole to form one or more recessed regions to facilitate the first evaporation of the first material or the second evaporation of the second material on or in proximity to a circuit component of the circuit components.

6. The method of forming a semiconductor device of claim 4, further comprising:

evaporating a third portion of the material along a third direction via a first shallow angle evaporation at a defined first angle with respect to the first pole; and evaporating a fourth portion of the material along a fourth direction via a second shallow angle evaporation at a defined second angle with respect to the second pole.

7. The method of forming a semiconductor device of claim 1, further comprising:

forming a first pole, a second pole, a third pole, and a fourth pole based on the forming of the trench, wherein the first pole comprises a first nub component at an end of the first pole, the second pole comprises a second nub component at an end of the second pole, the third pole comprises a third nub component at an end of the third pole, and the fourth pole comprises a fourth nub component at an end of the fourth pole.

8. The method of forming a semiconductor device of claim 7, further comprising:

evaporating a third portion of the material along a third direction; and evaporating a fourth portion of the material along a fourth direction.

* * * * *